United States Patent [19]

Williams

[11] Patent Number: 5,682,050
[45] Date of Patent: Oct. 28, 1997

[54] BIDIRECTIONAL CURRENT BLOCKING MOSFET FOR BATTERY DISCONNECT SWITCHING INCLUDING PROTECTION AGAINST REVERSE CONNECTED BATTERY CHARGER

[75] Inventor: Richard K. Williams, Cupertino, Calif.

[73] Assignee: Siliconix incorporated, Santa Clara, Calif.

[21] Appl. No.: 541,345

[22] Filed: Oct. 10, 1995

Related U.S. Application Data

[63] Continuation of Ser. No. 219,586, Mar. 29, 1994, abandoned, which is a continuation-in-part of Ser. No. 159,900, Nov. 30, 1993, Pat. No. 5,536,977.

[51] Int. Cl.⁶ .............................. H01L 29/76; H01L 29/74
[52] U.S. Cl. .................... 257/368; 327/404; 327/434; 327/436; 327/537; 327/541; 327/546
[58] Field of Search ...................... 257/368; 307/514, 307/499, 501, 503, 303.2; 327/328, 404, 434, 436, 537, 541, 545

[56] References Cited

U.S. PATENT DOCUMENTS

| | | | |
|---|---|---|---|
| 3,508,084 | 4/1970 | Warner, Jr. | 307/304 |
| 4,303,958 | 12/1981 | Allgood | 361/100 |
| 4,315,781 | 2/1982 | Henderson | 148/1.5 |
| 4,477,736 | 10/1984 | Onishi | 307/297 |
| 4,491,750 | 1/1985 | Janutka | 307/499 |
| 4,595,847 | 6/1986 | Weir | 307/499 |
| 4,639,761 | 1/1987 | Singer et al. | 357/234 |
| 4,659,942 | 4/1987 | Volp | 307/19 |
| 4,721,986 | 1/1988 | Kinzer | 357/23.4 |
| 4,961,100 | 10/1990 | Baliga et al. | 357/39 |
| 4,994,886 | 2/1991 | Nadd | 357/41 |
| 5,148,043 | 9/1992 | Hirata et al. | 307/66 |
| 5,260,594 | 11/1993 | Shimizu | 257/368 |
| 5,306,961 | 4/1994 | Leo | 307/296.3 |
| 5,357,157 | 10/1994 | Throngnumchai | 307/570 |
| 5,362,981 | 11/1994 | Sato et al. | 257/371 |
| 5,420,451 | 5/1995 | Williams et al. | 257/402 |
| 5,451,533 | 9/1995 | Williams et al. | 437/41 |

FOREIGN PATENT DOCUMENTS

| | | |
|---|---|---|
| 0 499 110 | 8/1992 | European Pat. Off. |
| 59 005659 | 1/1984 | Japan |
| 61 014760 | 1/1986 | Japan |
| 61 087374 | 5/1986 | Japan |
| 04 170815 | 6/1992 | Japan |

Primary Examiner—Ngân V. Ngô
Attorney, Agent, or Firm—Skjerven, Morrill, MacPherson, Franklin & Friel; David E. Steuber

[57] ABSTRACT

A bidirectional current blocking switch is disclosed. The switch includes a four-terminal MOSFET in which there is no source-body short. The voltages applied to the source and drain terminals are both higher than the voltage applied to the body terminal (for an N-channel) device so that the source-body and drain-body junction of the MOSFET never become forward-biased. The switch of this invention is particularly useful for switching a cascaded set of batteries in a portable computer. Also included is a disclosure of circuitry to protect the switch against a reverse connected battery charger.

16 Claims, 26 Drawing Sheets

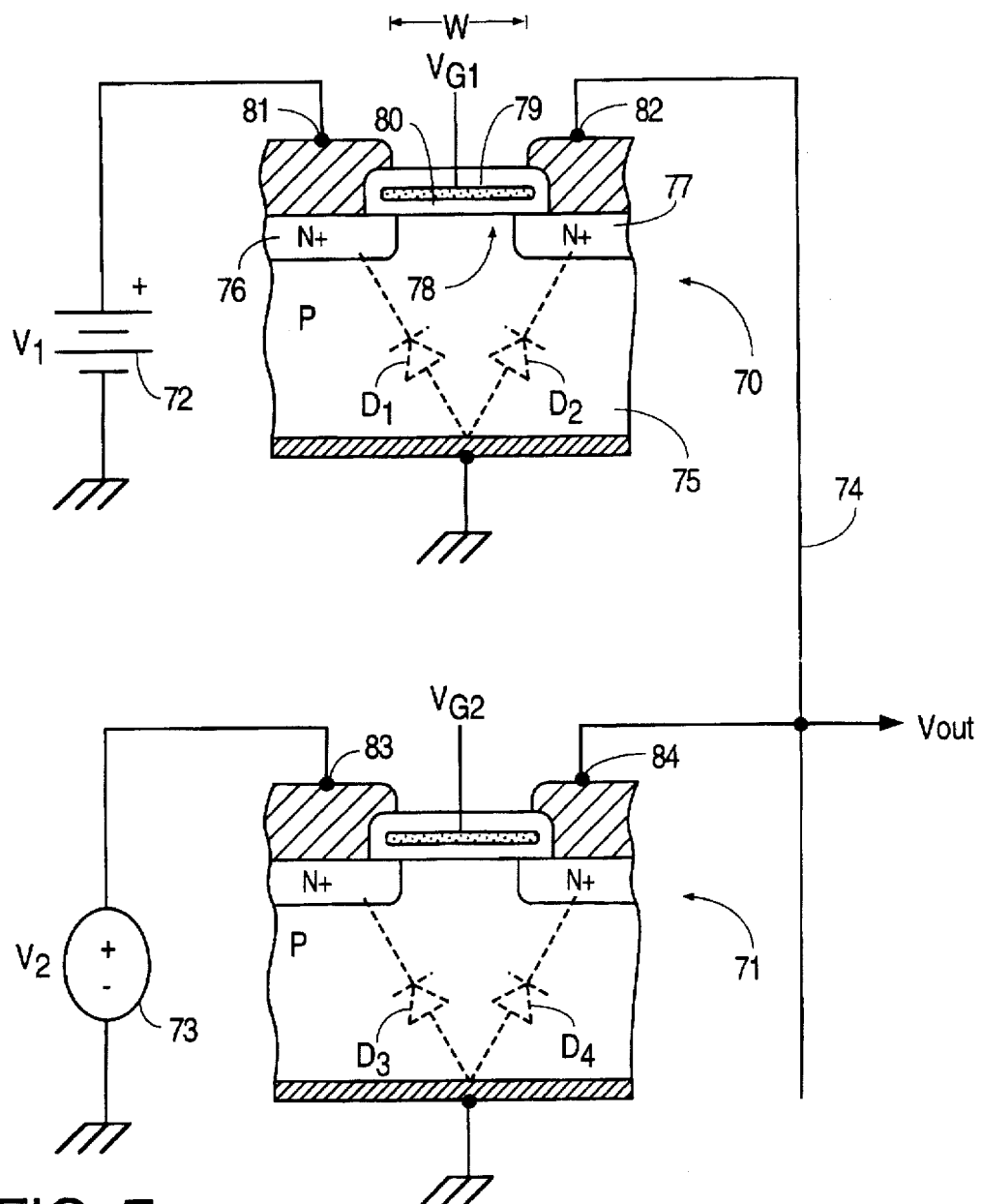
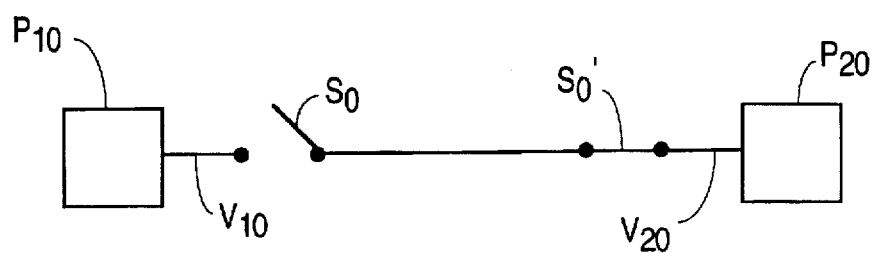
FIG. 7
FIG. 8

5,682,050

BIDIRECTIONAL CURRENT BLOCKING MOSFET FOR BATTERY DISCONNECT SWITCHING INCLUDING PROTECTION AGAINST REVERSE CONNECTED BATTERY CHARGER

This application is a continuation of application Ser. No. 08/219,586, filed Mar. 29, 1994, abandoned, which is a continuation-in-part of application Ser. No. 08/159,900, filed Nov. 30, 1993, now U.S. Pat. No. 5,536,977.

RELATED APPLICATIONS

This application is related to application Ser. No 08/160,560, filed Nov. 30, 1993, now U.S. Pat. No. 5,510,747, issued Apr. 23, 1996 and application Ser. No. 08/160,539, filed Nov. 30, 1993, now U.S. Pat. No. 5,420,451 issued on May 30, 1995, both of which are incorporated herein by reference.

FIELD OF THE INVENTION

This invention relates to a bidirectional current blocking MOSFET and in particular to the use of such a device in a battery disconnect circuit.

BACKGROUND OF THE INVENTION

Users of battery-powered devices such as notebook computers require that the devices be usable for long periods of time between battery recharges. This requirement has led to cascaded battery arrangements, in which a primary battery, a secondary battery, etc., are connected to the device in succession. Frequently an AC/DC converter is also provided to allow the user to conserve battery power when he is near a source of AC power. A connection for an external backup battery may also be provided.

Such an arrangement is illustrated in FIG. 1 wherein a primary battery B1 and a secondary battery B2 are connected via switches S1 and S2, respectively, to a load L, which could be a DC/DC converter supplying, for example, a notebook computer. The supply connections are made through a bus which is designated B.

Also connected to bus B is an AC/DC converter C3 which supplies power through a switch S3. The voltage supplied by primary battery B1 is designated $V_1$, the voltage supplied by secondary battery B2 is designated $V_2$, and the voltage supplied by AC/DC converter C3 is designated $V_3$. The voltage at bus B is designated $V_{bus}$. A backup battery B4 is also connected to bus B. Backup battery B4 provides power to some supervisory circuits and memory functions (not shown) when primary battery B1 and secondary battery B2 are discharged. To ensure that it is present when needed, backup battery B4 is not switched.

In the operation of this multiple battery arrangement, only one of Switches S1, S2, and S3 would normally be closed at any given time. The remaining switches would be open. When power is supplied by primary battery B1, for example, switch S1 is closed and switches S2 and S3 are open.

As the power sources are switched in and out, the voltage across switches S1, S2, and S3 can vary both in magnitude and direction. This is illustrated in FIGS. 2A–2C. As shown in FIG. 2A, for example, the output $V_2$ of battery B2 might be 14V at a given point in time. If battery B2 is then supplying power, the voltage $V_{bus}$ would also equal 14V. If battery B1 is fully charged, its output voltage $V_1$ might be 18V. In this case, the left side of switch S1 would be positively charged. On the other hand, assume the same situation except that battery B1 is discharged, so that $V_1$ is 6V. In this case, the right side of switch S1 is positively charged, as shown in FIG. 2B. A third alternative is illustrated in FIG. 2C where battery B1 is discharged, battery B2 is fully charged, and bus B is supplied by AC/DC converter C1. In the example, $V_1$ is shown as equalling 6V, $V_2$ is shown as equalling 17V, and $V_3$ is shown as equalling 12V. In this case, the right side of switch S1 is positively charged, and the left side of switch S2 is positively charged.

In summary, any of switches S1–S3 may have to withstand a voltage in either direction. The only thing known for certain is that all of the voltages applied to these switches will be above ground.

The device may also be equipped with an internal battery charger, as illustrated in FIG. 3. A battery charger C5 is connected to battery B1 via a switch S4 and to battery B2 via a switch S5. Battery charger C5 may be supplied from the output of AC/DC converter C3 or (optionally) directly from the power main. As illustrated in FIG. 4, battery charger C5 may deliver a voltage as high as 24V for quick battery charging. In the condition illustrated in FIG. 4, battery B2 is being charged, and the $V_1$ output of battery B1 is equal to 12 volts. Switch S4 therefore must withstand a voltage difference of 12V. However, since deep discharging of a rechargeable battery is known to extend its life, $V_1$ could drop to below 6V, in which case switch S4 would need to withstand over 18V, with its left side being positively charged. On the other hand, when battery charger C5 is not operative it may have a shorted or leaky characteristic, and switches S4 and S5 would then have to block voltages in the other direction. Therefore, switches S4 and S5 must also be bidirectional current blocking.

The foregoing would not represent a problem if switches S1–S5 were mechanical switches. However, it is preferable to use semiconductor technology, and in particular MOSFET technology, in fabricating these switches. Power MOSFETs are typically fabricated with a source-body short to ensure that the intrinsic bipolar transistor (represented by the source, body and drain regions) remains turned off at all times. The prior art teaches generally that a good source-body short is fundamental to reliable parasitic-bipolar-free power MOSFET operation. See, for example, "Power Integrated Circuits", by Paolo Antognetti, McGraw-Hill, 1986, pp. 3.27–3.34.

The use of a source-body short has the effect of creating a diode across the drain and body terminals of the MOSFET which is electrically in parallel with the MOSFET. For a P-channel device, the cathode of the diode is connected to the drain; for an N-channel device, the anode of the diode is connected to the drain. Thus, a MOSFET must never be exposed to voltages at its source-body and drain terminals which would cause the "antiparallel" diode to become forward-biased. FIGS. 5A–5D illustrate the polarity of the antiparallel diode (shown in hatched lines) for a vertical N-channel DMOS device (FIG. 5A), a vertical P-channel DMOS device (FIG. 5B), a lateral N-channel device (FIG. 5C), and a lateral N-channel DMOS device (FIG. 5D).

Accordingly, conventional MOSFETs are not suitable for switches S1–S5 because they are not capable of blocking bidirectional currents. In FIGS. 2A–2C, for example, the antiparallel diodes across switches S1 and S2 are shown in hatched lines, with their anode and cathode terminals arranged so as would be required to block the flow of current through the switches. If the polarity of the voltages across the switches were reversed, the antiparallel diodes would become forward-biased.

One possible solution to this problem would be to connect two MOSFETs in a back-to-back arrangement, as illustrated schematically in FIGS. 6A–6C. FIG. 6A illustrates a pair of NMOS devices having a common source, FIG. 6B illustrates a pair of NMOS devices having a common drain, and FIG. 6C illustrates a pair of PMOS devices having a common source. These back-to-back arrangements double the on-resistance of the switches, however, and therefore detract significantly from the amount of power delivered to the computer or other device.

Moreover, when a battery charger is used in the arrangement, the connections between the battery charger and the battery may become reversed. For example, some of the connectors used for battery chargers have interchangeable polarities, and some battery chargers contain a switch which allows the polarity of the output to be reversed. In such situations, a battery disconnect switch may be exposed to a negative rather than a positive voltage.

Accordingly, what is needed is a bidirectional current blocking semiconductor switch which has the on-resistance of a normal MOSFET and yet does not contain an antiparallel diode across its drain and body terminals. Preferably, the bidirectional current blocking semiconductor switch should also be able to withstand a reversed battery charger condition.

SUMMARY OF THE INVENTION

In a bidirectional current blocking switch in accordance with this invention, a power MOSFET includes a source region, a body region, a drain region and a gate, of which is connected to a terminal. The source and body regions are not shorted together, and voltages that are applied to the source and drain terminals are both either higher than (for an N-channel device) or lower than (for a P-channel device) a voltage at which the body region is maintained. The source, body and drain voltages are established such that the source-body and drain-body junctions of the device are never forward-biased.

In a preferred embodiment, the device is a four-terminal N-channel MOSFET, the body region is grounded, and the voltages at the source and drain terminals are never allowed to fall below ground. Thus, the junctions between the P-type body region and the N-type source and drain regions never become forward biased. Provided that the gate voltage transitions which turn the device on and off are fast and the load is relatively capacitive or resistive (but not inductive), the parasitic bipolar transistor represented by the source, body and drain regions will not be activated.

Moreover, the on-resistance of a device according to this invention is dramatically lower than either an N-channel DMOS AC switch or a P-channel DMOS AC switch (frequently referred to as a bilateral switch).

A bidirectional blocking switch according to this invention is capable of conducting current in either direction and is capable of blocking current whether the source is more positive than the drain or the drain is more positive than the source. Moreover, the switch of this invention is capable of inhibiting current between two voltages provided by two different power sources. Neither the source terminal nor the drain terminal need be tied to a fixed or regulated voltage. When the switch is turned on, it quickly pulls the voltage on each side to approximately the same level. (In this specification, the terms "source" and "drain" are frequently used to denote the terminals of the MOSFET even though either terminal may be more positive than the other.)

According to another aspect of this invention, a battery disconnect switch is protected against exposure to a negative voltage created by, for example, a reverse-connected battery charger. A pair of source-body shorted MOSFETs are connected back-to-back in series between the gate and source terminals of the battery disconnect switch (the source terminal of the switch being connected to the battery charger). The gates of the series-connected MOSFETs are grounded. A third source-body shorted MOSFET is connected between the body and source terminals of the battery disconnect switch. The gate of the third MOSFET is connected to the drain terminal of the battery disconnect switch (the drain terminal of the switch being connected to the battery).

In an alternative embodiment, a MOSFET not having a source-body short is substituted for the back-to-back MOSFETs.

BRIEF DESCRIPTION OF THE DRAWINGS

FIG. 7 illustrates a multiple source power supply arrangement containing disconnect switches in accordance with this invention.

FIG. 8 illustrates schematically the general case of a switch according to this invention.

DESCRIPTION OF THE INVENTION

Figure 1:
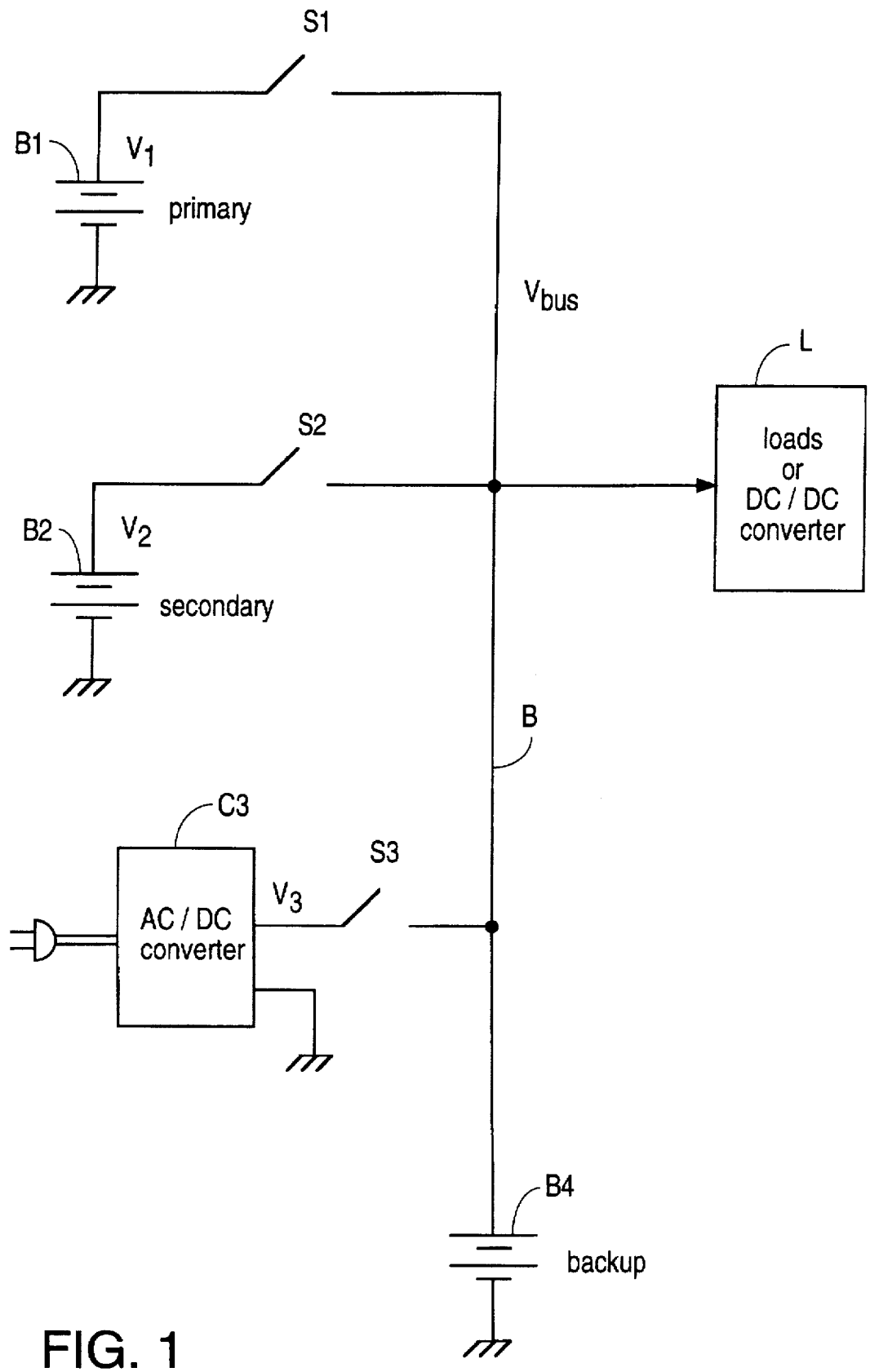
FIG. 1 illustrates a schematic drawing of a multiple source power supply arrangement, including disconnect switches.
Figure 2A:
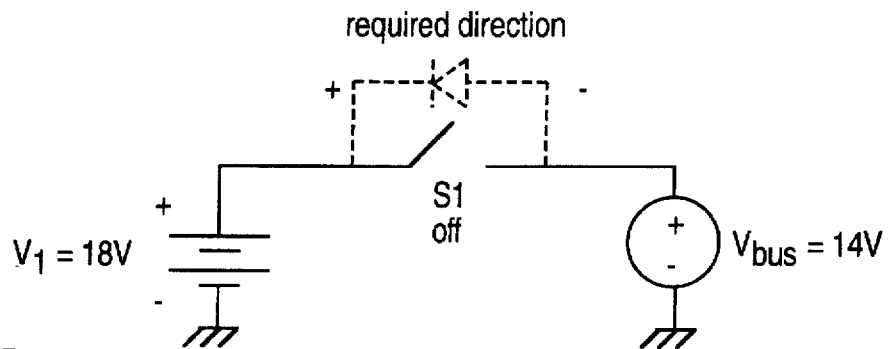
FIGS. 2A, 2B and 2C illustrate possible voltage differences encountered by the disconnect switches shown in FIG. 1.
Figure 2B:
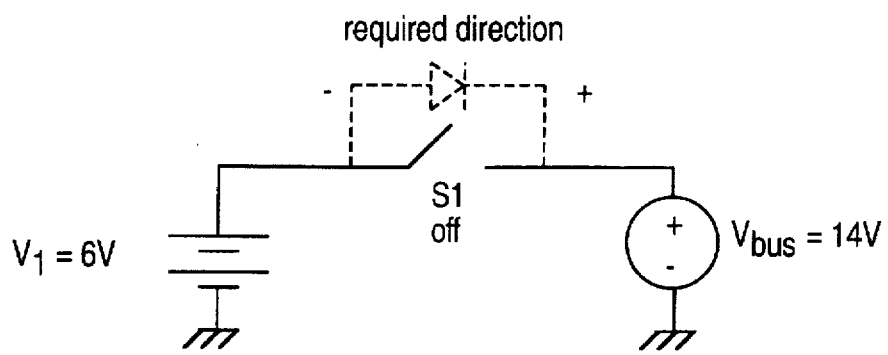
Figure 2C:
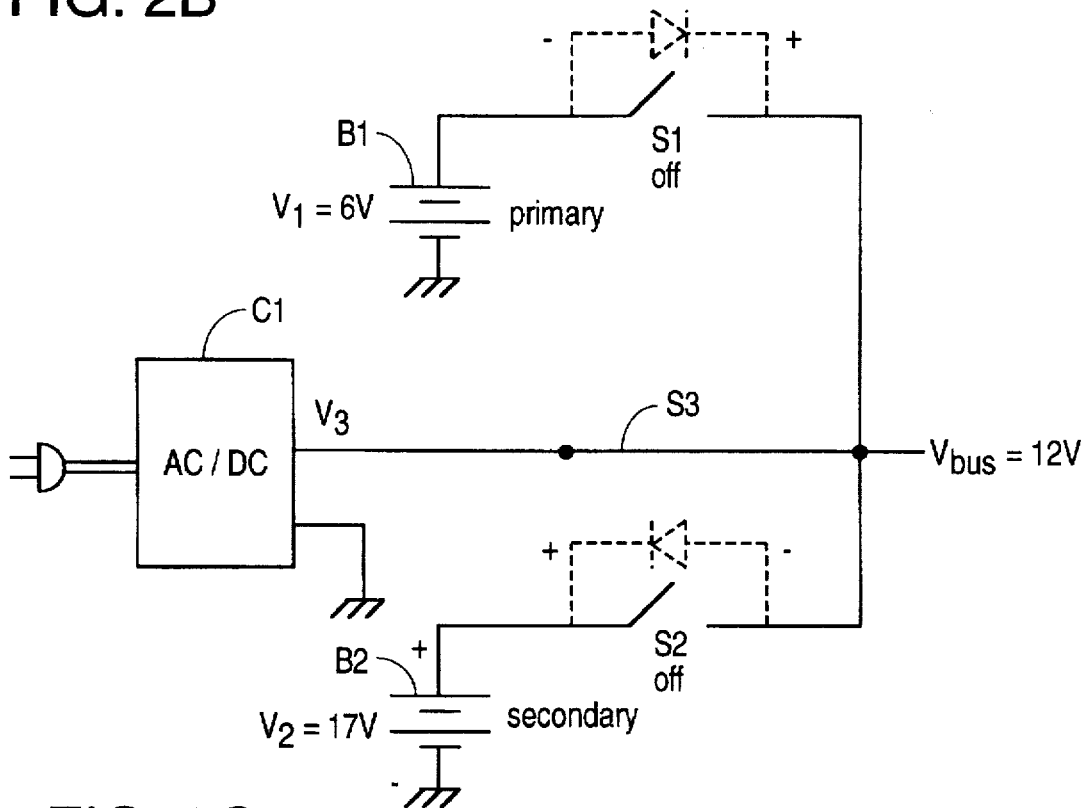

FIG. 7 illustrates a multiple source power supply arrangement containing bidirectional current blocking switches 70 and 71 in accordance with the invention. Switch 70 is connected to a battery 72, which supplies a voltage $V_1$, and switch 71 is connected to an AC/DC converter 73 or another battery, which supplies a voltage $V_2$. Switches 70 and 71 connect into a bus 74, which supplies an output voltage $V_{out}$ to a load. While two power sources and two switches are illustrated in FIG. 7, will be apparent that any number of batteries or other power sources could be included in the arrangement.

Switch 70 is a lateral MOSFET which is illustrated in cross section. MOSFET 70 is preferably formed in either a stripe or cellular pattern in a substrate 75, which in this embodiment is formed of P-type semiconductor material. N+ regions 76 and 77 are formed at the surface of P substrate 75, separated by a channel region 78. A gate 79 is formed over channel region 78, separated from channel region 78 by an oxide layer 80. A terminal 81 connects N+ region 76 to battery 72 and a terminal 82 connects N+ region 77 to bus 74. Gate 79 is supplied by a gate voltage $V_{G1}$. It will be noted that switch 70 is a symmetrical device, and regions 76 and 77 are not referred to as source or drain regions, since either of them can be biased positively or negatively relative to each other.

The junction between P substrate 75 and N+ region 76 is represented by a diode $D_1$ and the junction between P substrate 75 and N+ region 77 is represented by a diode $D_2$.

In a conventional manner, the gate voltage $V_{G1}$ is held low when switch 70 is turned off, and is raised to a positive voltage when switch 70 is turned on. Since P substrate 75 is grounded, and since the voltage at terminals 81 and 82 can only be positive, it is apparent that one of diodes $D_1$ and $D_2$ is always reverse-biased when switch 70 is turned off. Accordingly, when switch 70 is off it blocks current whether the voltage at terminal 81 is higher or lower than the voltage at terminal 82.

Neither N+ region 76 nor N+ region 77 is shorted to P substrate 75. Despite the lack of a source-body short, the NPN transistor represented by N+ regions 76 and 77 and P substrate 75 will not become activated, provided that the on-off transitions at gate 79 are fast relative to the reaction time (capacitance) of the load. Since this circuit acts like a follower, i.e., a common drain configuration relative to the most positive side, an on-state bipolar transistor immediately develops a reverse-biased source voltage which keeps the bipolar transistor turned off. In other words, at the onset of conduction, the formation of the channel in the MOSFET causes the voltage on both sides of the MOSFET to normalize to approximately the same voltage. Presuming that the more negative potential is from a discharged battery or load and the more positive potential is from a power source or fully-charged battery, the more negative potential will rise to a voltage near the positive value when the switch is activated. At the outset of conduction, even if the more negative terminal is at zero volts, the beginning of conduction will immediately raise the more negative potential to a voltage above ground, thereby reverse-biasing the junction. The gate should be driven rapidly to minimize the duration of the switching transition. The fact that neither N+ terminal (i.e., source or drain) is permanently tied to ground is a distinguishing feature of the bidirectional blocking switch. Another distinguishing characteristic is its possible connection to voltage sources of limited energy, such as batteries, where voltage decays with time. The bidirectional blocking switch is therefore not a "high side" switch (permanently tied to a fixed positive supply rail, present whenever circuit operation is desired), since batteries and even AC adapters may discharge or be unplugged. Likewise, it is not a "low side" switch because neither side is tied permanently to ground. Instead, it acts like a reversible source follower when conducting, with the more positive voltage acting as the drain and the more negative voltage as the source.

Switch 71 is identical to switch 70 but has terminals designated 83 and 84 and is controlled by a gate voltage $V_{G2}$. Thus, whatever the voltages applied to terminals 81-84, switches 70 and 71 will block currents whenever their respective gate voltages $V_{G1}$ and $V_{G2}$ are low, provided that the voltage differences across the switch remain below the breakdown voltage of the internal diodes. The breakdown voltages of the internal diodes would normally be in the range of 8V to 12V to 14V. Switches 70 and 71 can therefore be controlled to selectively connect or isolate battery 72 and AC/DC converter 73 without concern that an antiparallel diode in the switches will become forward-biased. Switches of this invention can be used for any of switches S1-S5 shown in FIGS. 1 and 4.

An arrangement for driving the gate voltages $V_{G1}$ and $V_{G2}$ to a level necessary to turn switches 70 and 71 on is described in the above-referenced application Ser. No. 08/160,560, now U.S. Pat. No. 5,510,747.

It should be noted that, while switches 70 and 71 appear in cross section to be conventional lateral N-channel MOSFETS, each of them has a large gate width W in order to achieve a low on-resistance, typically below 200 mΩ and as low as 60 mΩ. Moreover, in the operation of a conventional MOSFET, it is not common to subject both the source and drain terminals to voltages originating from more than one power source, nor is it common to operate a conventional MOSFET as a bidirectional source follower, i.e., without specifying which terminal acts as the higher (drain) terminal (in an NMOS device) which supplies current and which terminal acts as the lower (source) terminal, which sinks current to ground through a load. Conventional source followers, for example, have one terminal connected directly or indirectly to a power supply or a bus while the other terminal is always the output of the follower. In other words, there is a permanent directional relationship between the battery (or bus) voltage, the drain voltage, and the source voltage (in ascending order). This relationship is not valid in a disconnect switch since either side may be higher at any given time. Similarly, switches 70 and 71 are unlike an N-channel transmission gate in logic arrays (referred to as pass-transistor logic), since in such logic arrays only one supply is present.

FIG. 8 illustrates schematically the general case of a switch $S_0$ according to this invention connected between power sources $P_{10}$ and $P_{20}$. Power sources $P_{10}$ and $P_{20}$ generate voltages $V_{10}$ and $V_{20}$. Switch $S_0$ will block current whether $V_{10} > V_{20}$ or $V_{20} > V_{10}$, and will conduct current from $P_{10}$ to $P_{20}$ or from $P_{20}$ to $P_{10}$. Source $P_{20}$ may be disconnected entirely from the circuit via a second switch $S_0'$.

Figure 9:
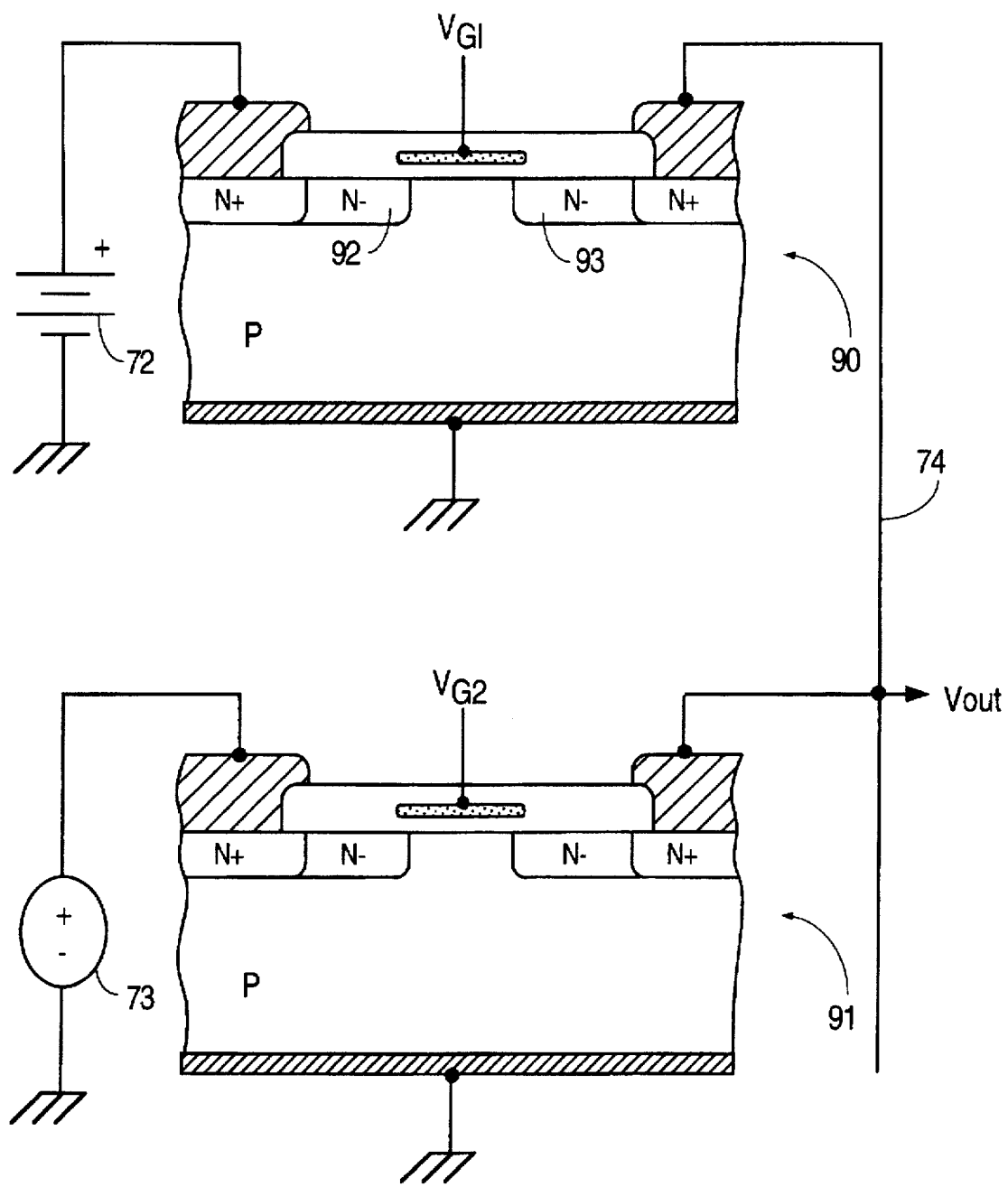
FIG. 9 illustrates a multiple source power supply arrangement with disconnect switches consisting of drifted MOSFETs which are capable of switching higher voltage differences.

FIG. 9 illustrates a drifted version of switches 70 and 71, which is capable of withstanding higher voltage differences (for example, 15V, 18V or 24V). A switch 90 contains N-drift regions 92 and 93, which serve to limit the strength of the electric field across oxide region 94. Drift regions are described more fully in U.S. Pat. No. 5,237,193, to Williams, issued Aug. 17, 1993, which is incorporated herein by reference. Since the gate must be biased sufficiently positive relative to ground to allow the device to conduct over the specified operating range, the oxide separating the gate from the channel region must be thick enough to accommodate the maximum gate voltage reliably. Since either side of switch 90 may serve as the "drain" in a given situation, a drift region must be provided on both sides of the channel region.

The drifted embodiment illustrated in FIG. 9 is useful if the voltage across the switch is above about 14V. In such situations the drift region prevents the gate oxide from exposure to high electric fields.

To turn the switch on, the gate voltage of switch 90 may either be fixed or may be a voltage slightly higher than $V_1$. If the gate voltage is a fixed value relative to ground (for example, 30V) a standard gate oxide thickness (200–400 Å) will not support the gate-to-substrate bias at the moment of turn on, and a thicker gate (for example, over 700 Å) must be used. If the gate potential is limited to 10V above the more negative terminal voltage and rises with that voltage, then the thicker oxide is not needed.

Figure 10A:
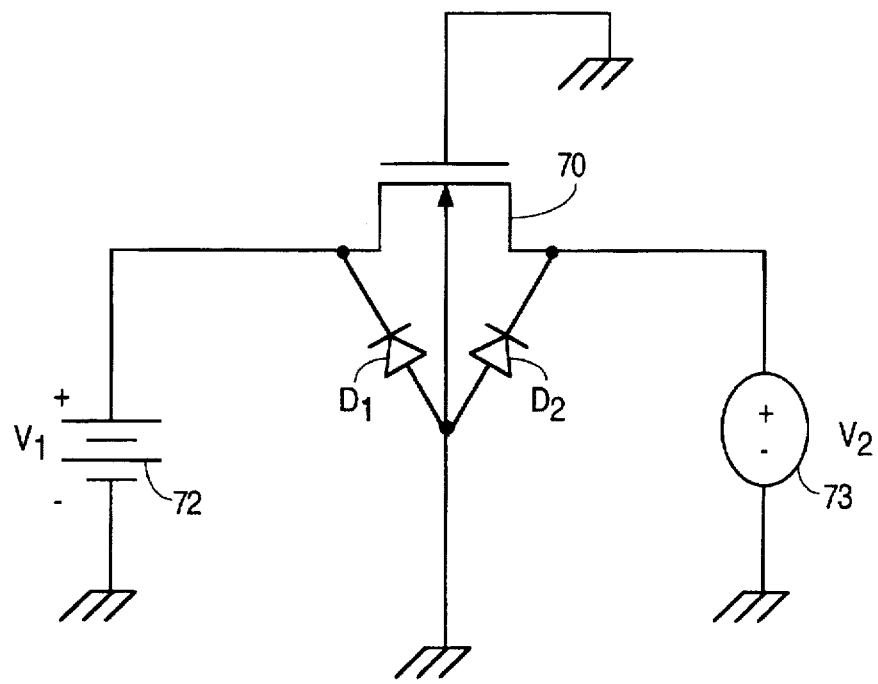
FIGS. 10A and 10B illustrate schematically the off-state and the on-state, respectively, of the switches illustrated in FIGS. 7 and 8.
Figure 10B:
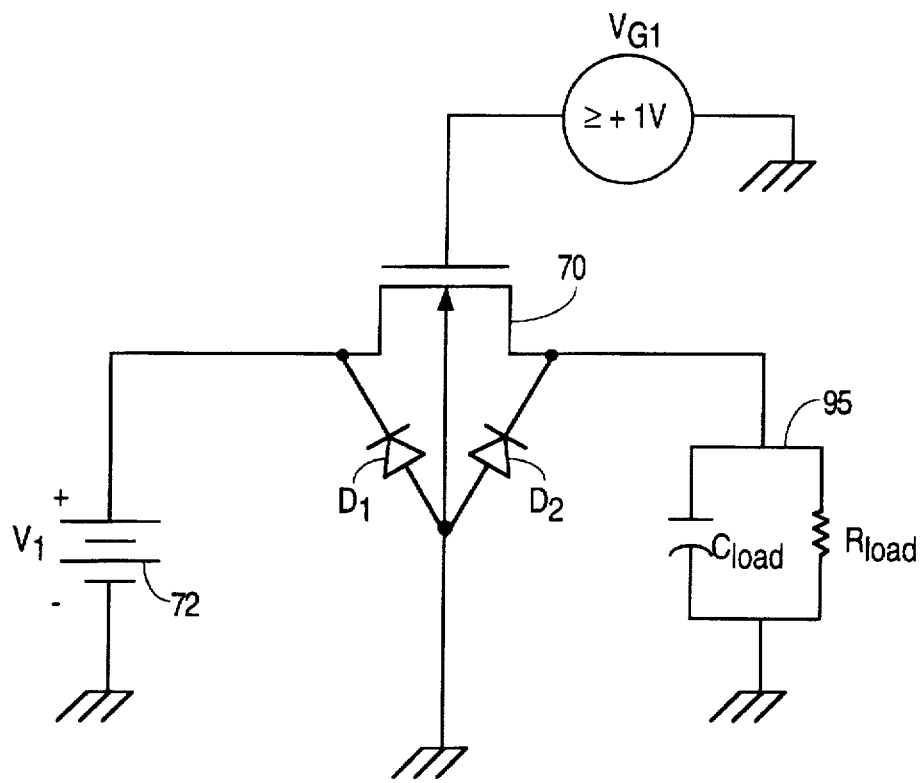

FIGS. 10A and 10B illustrate an example of the two states of switch 70 shown in FIG. 7. In FIG. 10A, the gate of switch 70 is grounded and switch 70 is turned off, isolating battery 72 from AC/DC converter 73. This would be the situation, for example, when AC/DC converter is supplying the load. Assuming that $V_2$ is greater than $V_1$, diode $D_2$ blocks current from flowing through switch 70.

FIG. 10B illustrates the situation when the gate of switch 70 is biased at least one volt above ground. Switch 70 is then turned on, allowing battery 72 to supply a load 95, which includes a capacitance $C_{load}$ and resistance $R_{load}$.

Figure 11A:
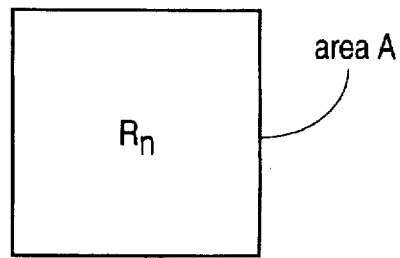
FIGS. 11A–11D illustrate conceptually the reduced on-resistance which is obtained using a bidirectional blocking switch in accordance with this invention.
Figure 11B:
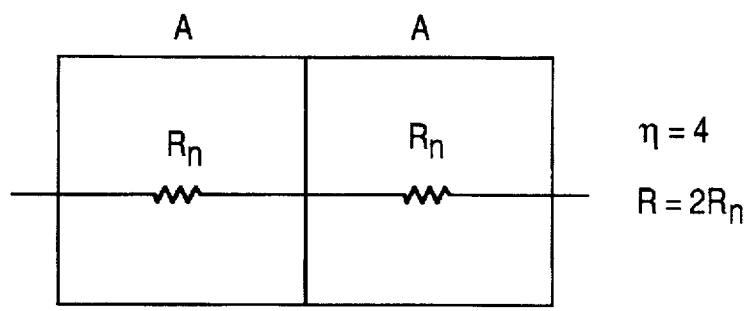

FIGS. 11A–11D illustrate a further advantage of bidirectional current blocking switches in accordance with this invention, namely, their significantly improved on-resistance. FIG. 11A shows an area A which represents the surface area of a lateral or vertical N-channel MOSFET. The on-resistance associated with the area A is designated $R_n$, which is typically 1 milliohm for each square cm in area A. A single P-channel device exhibits a resistance which is approximately $2.5R_n$ because of hole mobility which is poor relative to electron mobility. At voltages below about 20V, the resistance per unit area is about the same whether the device is a vertical or lateral MOSFET. Even though the number of cells per unit area in a lateral MOSFET is nearly double that of a vertical DMOS, (because no area need be wasted on source-body shorts) half the cells in the lateral MOSFET are drain cells, whereas in the vertical DMOS the drain is on the bottom of the substrate.

Figure 11C:
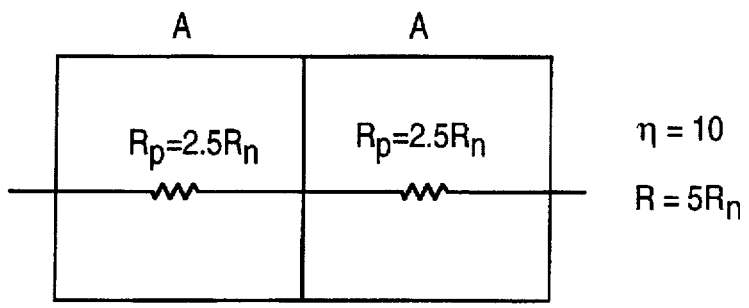

Returning to FIGS. 11A–11D, FIG. 11B represents the resistance of back-to-back N-channel DMOS devices, which occupy an area 2A. This resistance is shown as $2R_n$ because the devices must be connected in series. As shown in FIG. 11C, for P-channel devices, the resistance of back-to-back devices is equal to about $5R_n$.

Figure 11D:
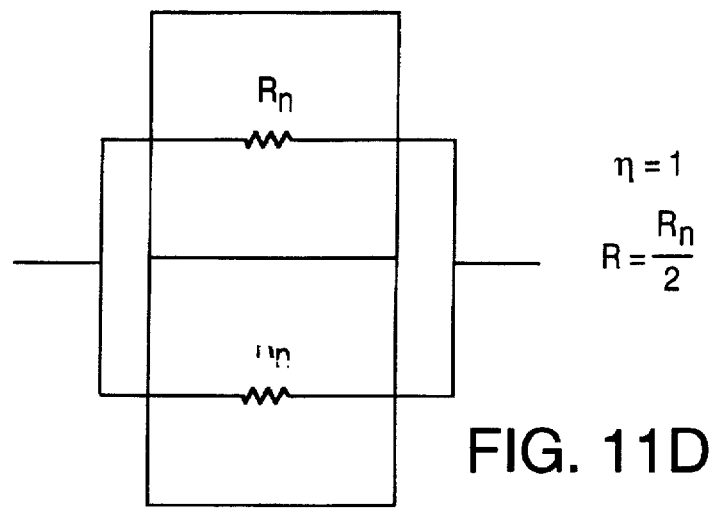

FIG. 11D illustrates that, because the device of this invention requires only a single MOSFET, the MOSFETS can be connected in parallel rather than in series. A pair of parallel N-channel MOSFETS has a resistance equal to $R_n/2$, which is only one-fourth the resistance of the back-to-back N-channel arrangement shown in FIG. 11B, and one-tenth the resistance of the back-to-back P-channel arrangement shown in FIG. 11C. Using the principles of this invention thus permits a dramatic reduction in the on-resistance, as compared with a back-to-back MOSFET arrangement. The resistance of the single N-channel MOSFET disconnect switch is assumed to be low because its gate drive is increased in relation to the voltage on its more negative terminal in order to maintain a constant channel resistance.

Figure 3:
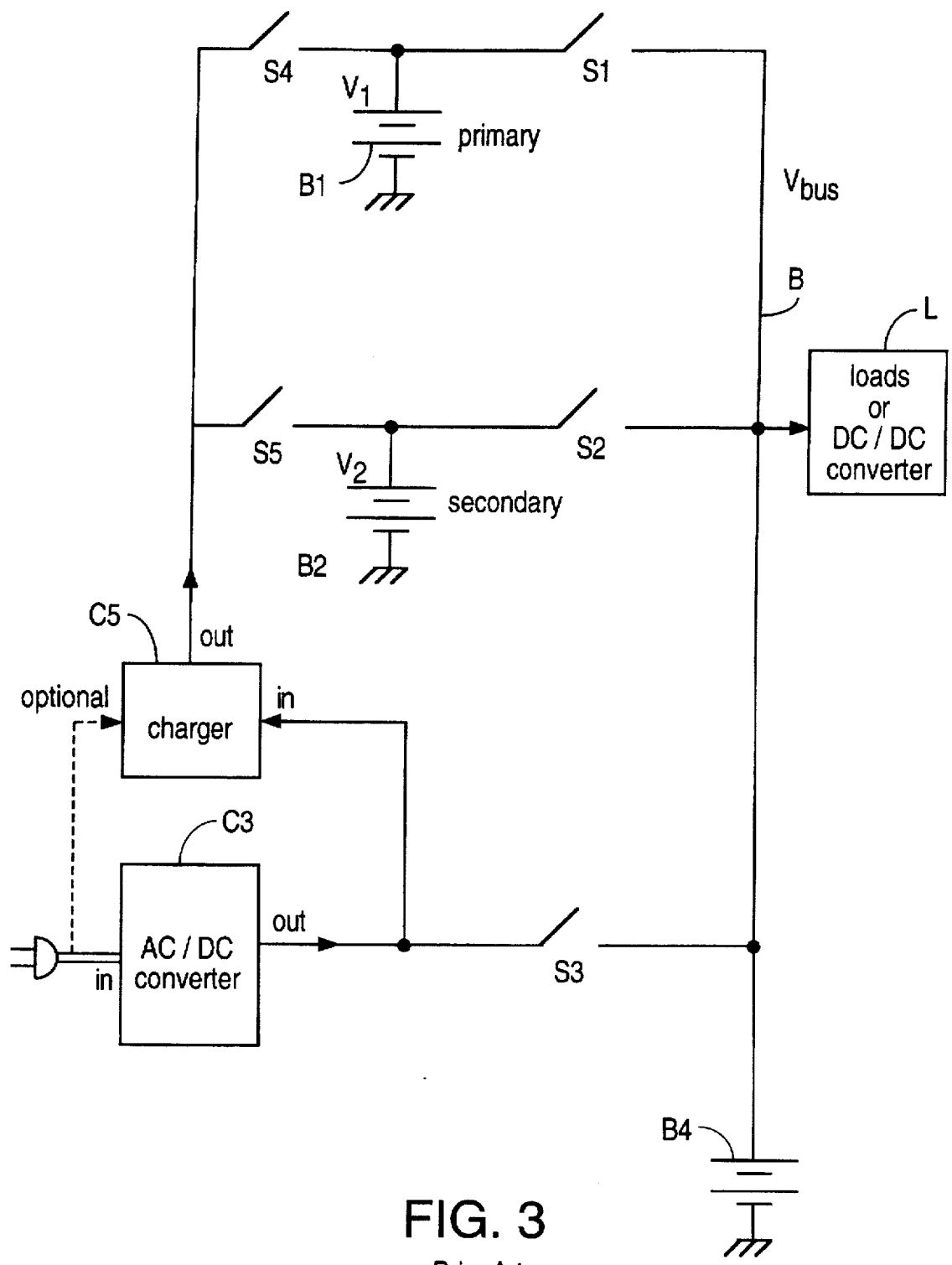
FIG. 3 illustrates a schematic diagram of a multiple source power supply arrangement, including a battery charger.
Figure 4:
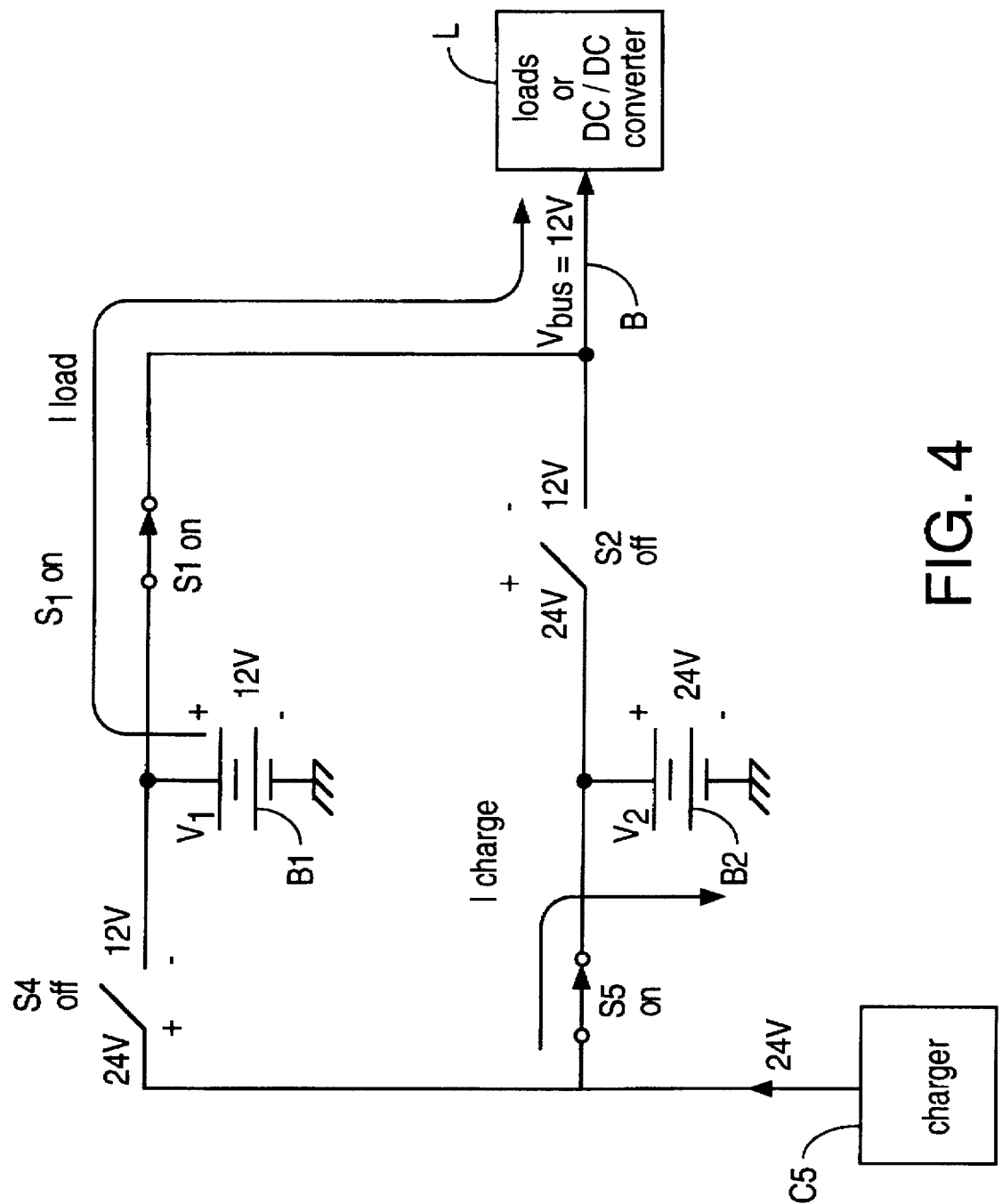
FIG. 4 illustrates possible voltage differences encountered by the disconnect switches shown in FIG. 3.
Figure 5A:
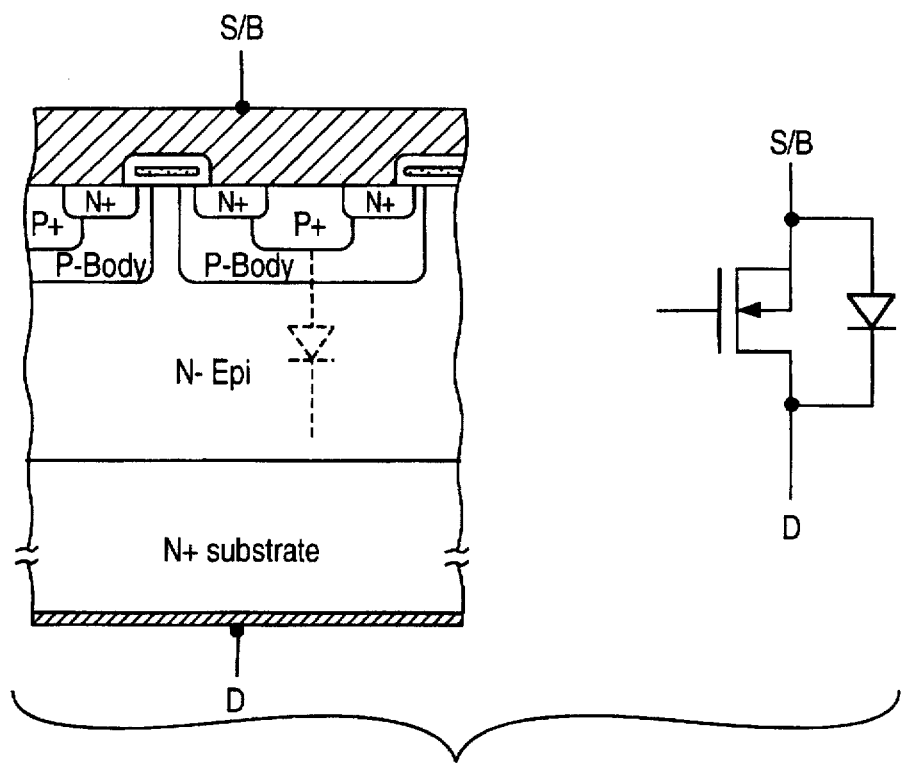
FIGS. 5A–5D illustrate, respectively, a vertical N-channel double-diffused MOSFET (DMOS), a vertical P-channel DMOS MOSFET, a lateral N-channel MOSFET, and a lateral N-channel DMOS MOSFET, all of which contain a source-body short.
Figure 5B:
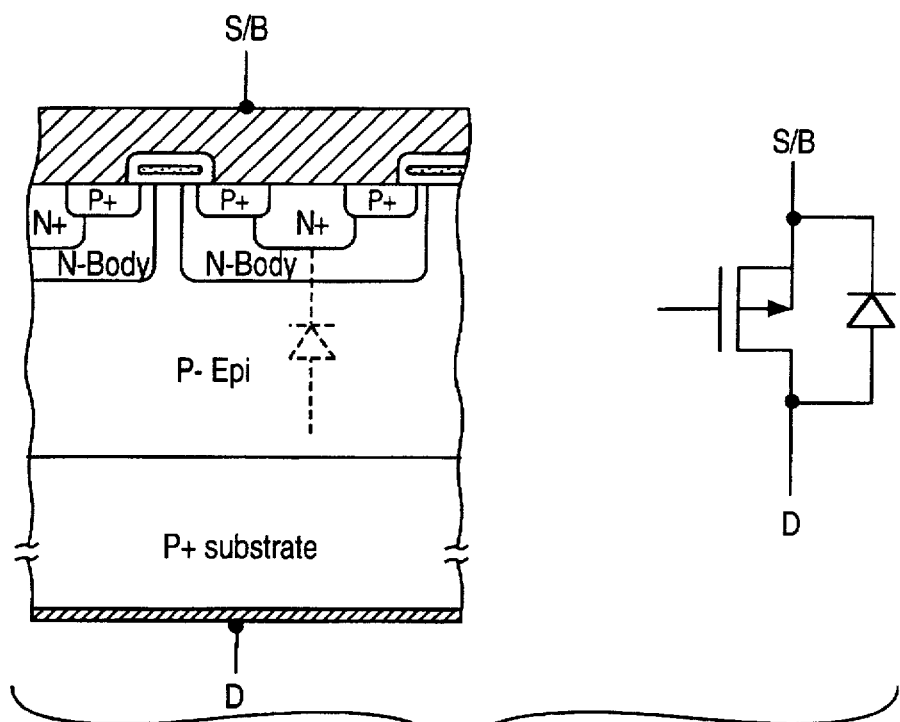
Figure 5C:
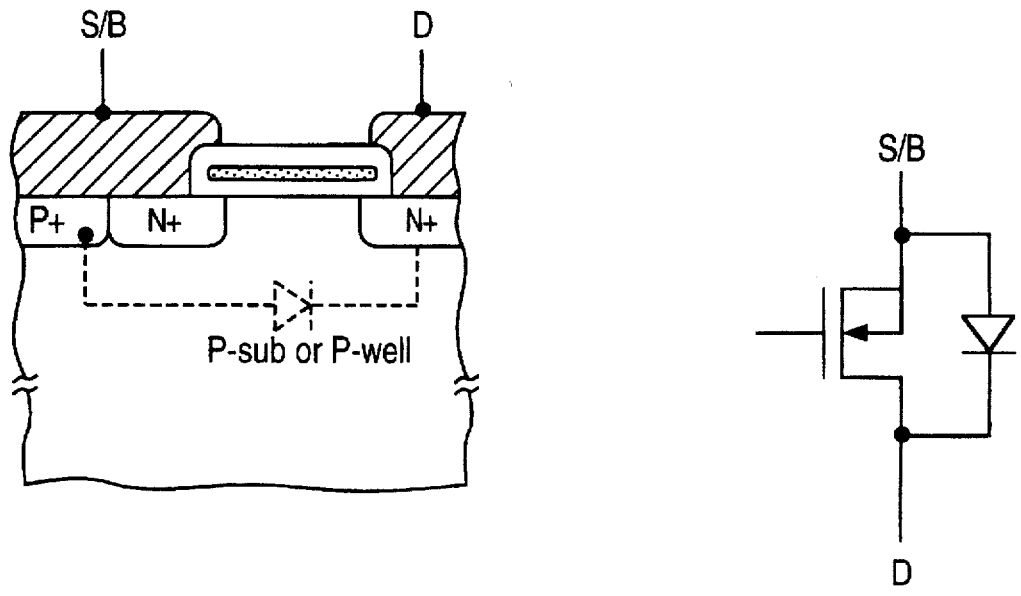
Figure 5D:
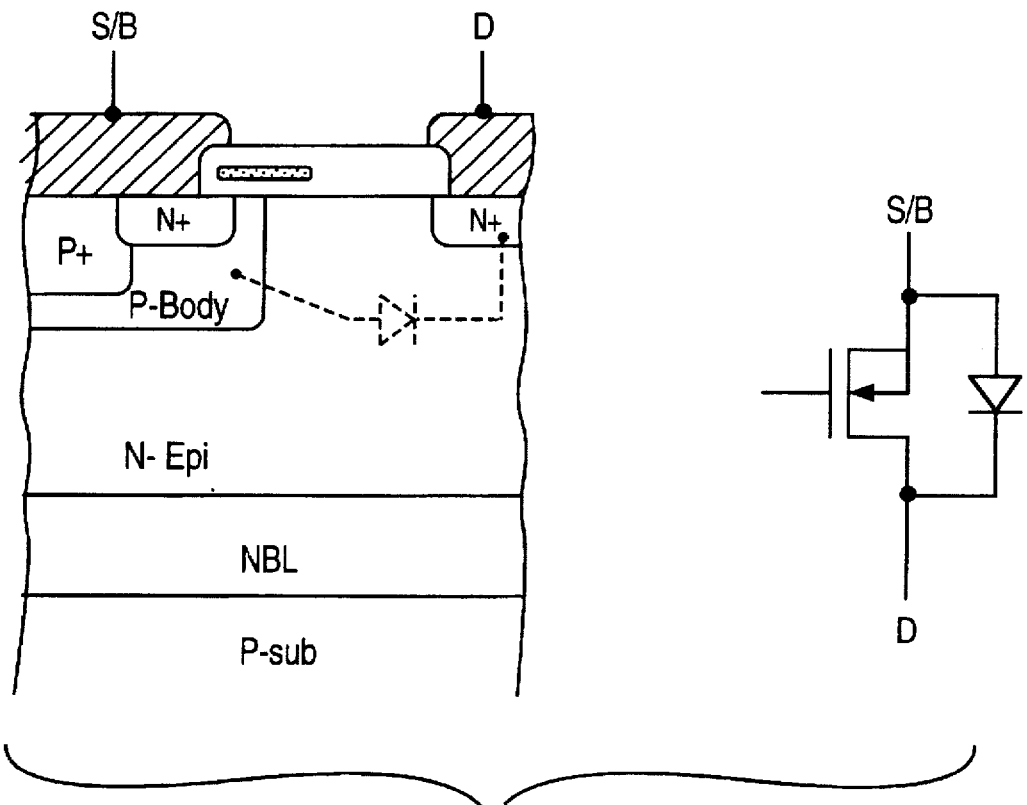
Figure 12A:
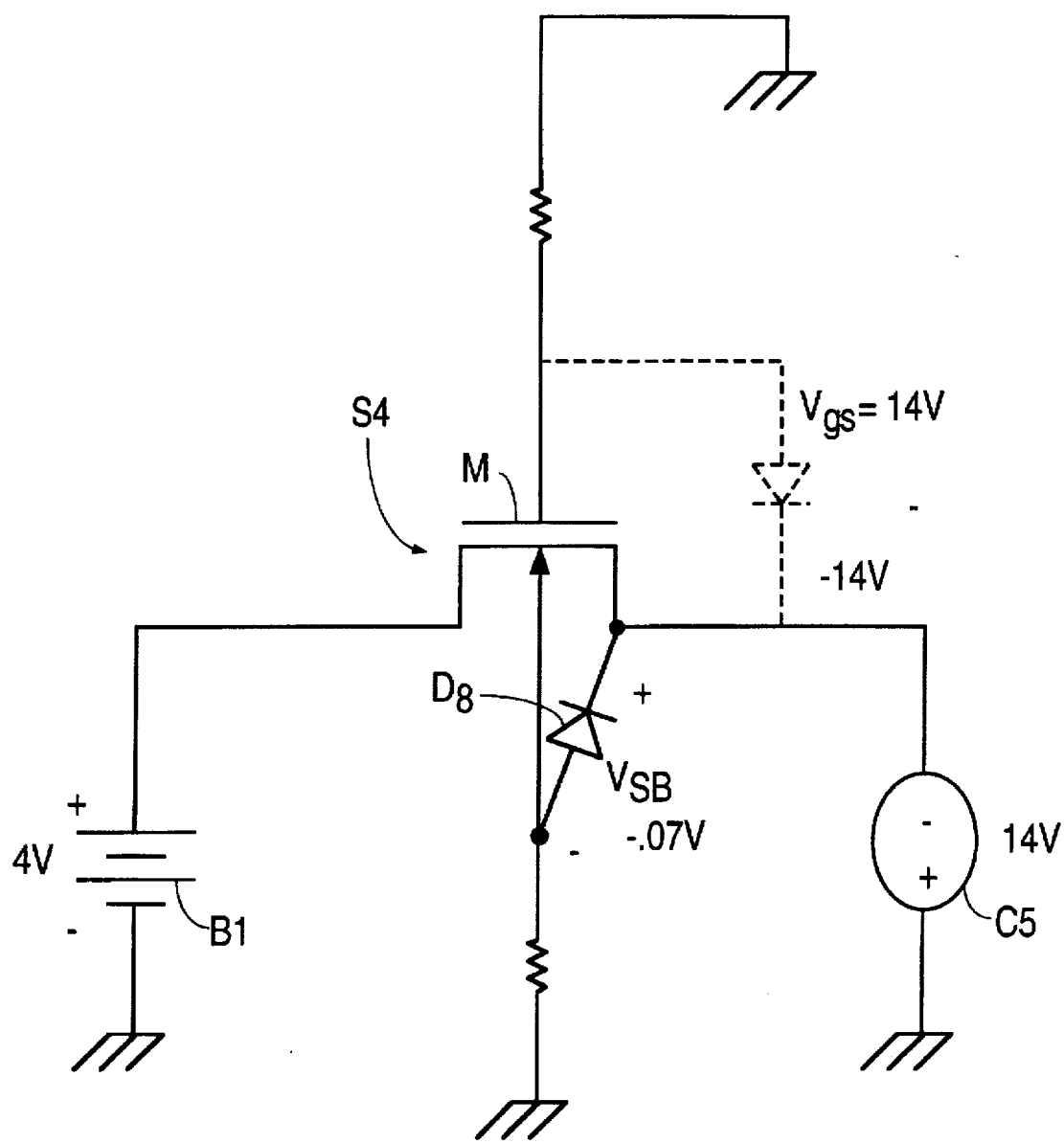
FIG. 12A illustrates a battery disconnect switch with no protection against a reversed battery charger.

FIG. 12A illustrates the problem that may occur if the battery charger C5 shown in FIGS. 3 and 4 is connected in reverse to bidirectional current blocking switch S4, which includes a non source-body shorted N-channel MOSFET M. A diode D8 represents the junction between the body and source regions of MOSFET M. Battery charger C5 is assumed to deliver an output as high as 14V, and battery B1 is assumed to deliver an output, for example, of 4V. Accordingly, if battery charger C5 is reversed, the voltage at the source terminal of MOSFET M is –14V, and a total voltage of 18V appears across switch S4. In this condition, both MOSFET M and its intrinsic bipolar transistor are turned on, and switch S4 will be destroyed. (The intrinsic bipolar transistor within MOSFET M is shown as transistor Q3 in FIG. 12E.)

Figure 12B:
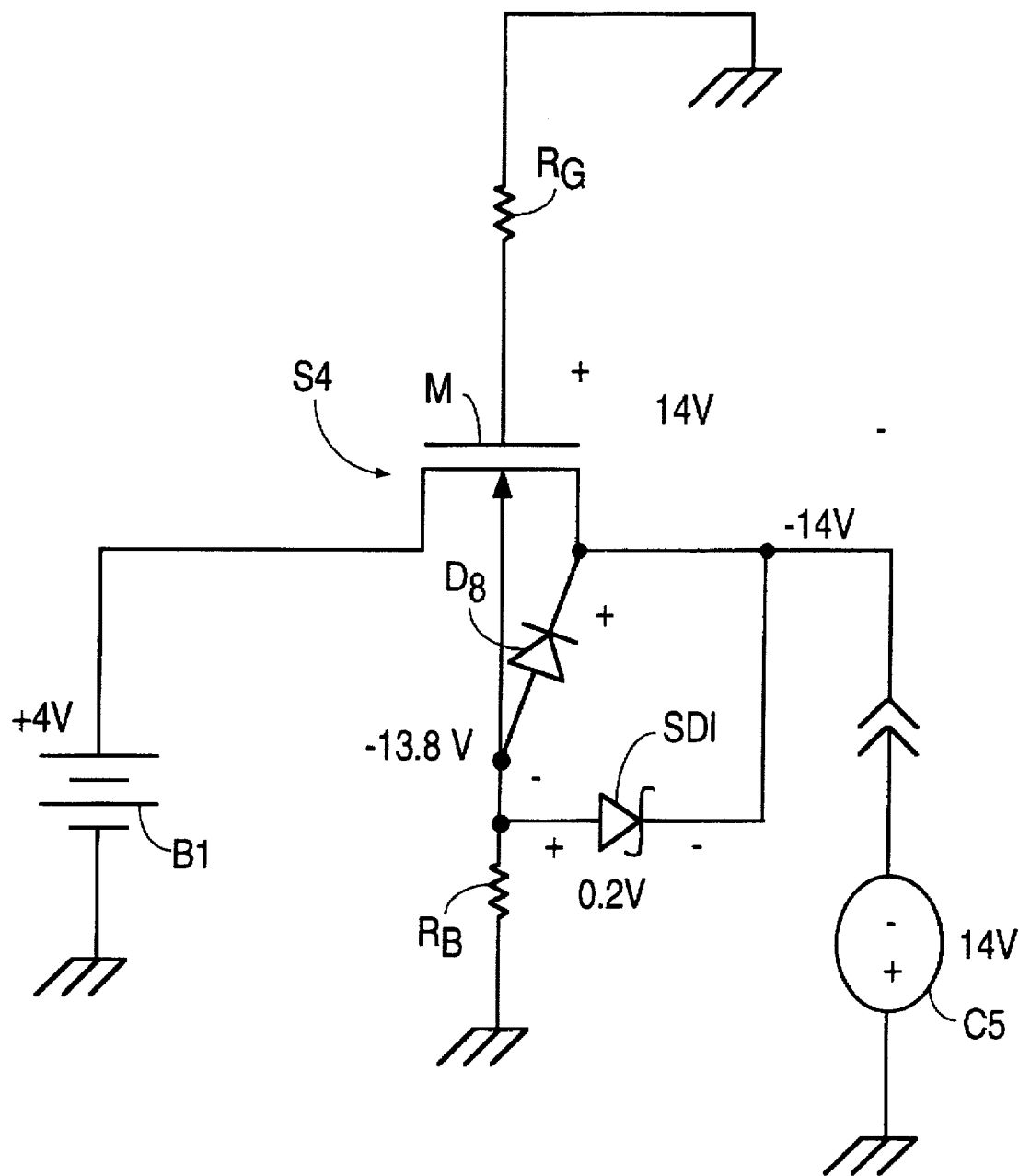
FIGS. 12B–12G illustrate the difficulties with several possible ways of protecting a battery disconnect switch against a reversed battery charger.
Figure 12C:
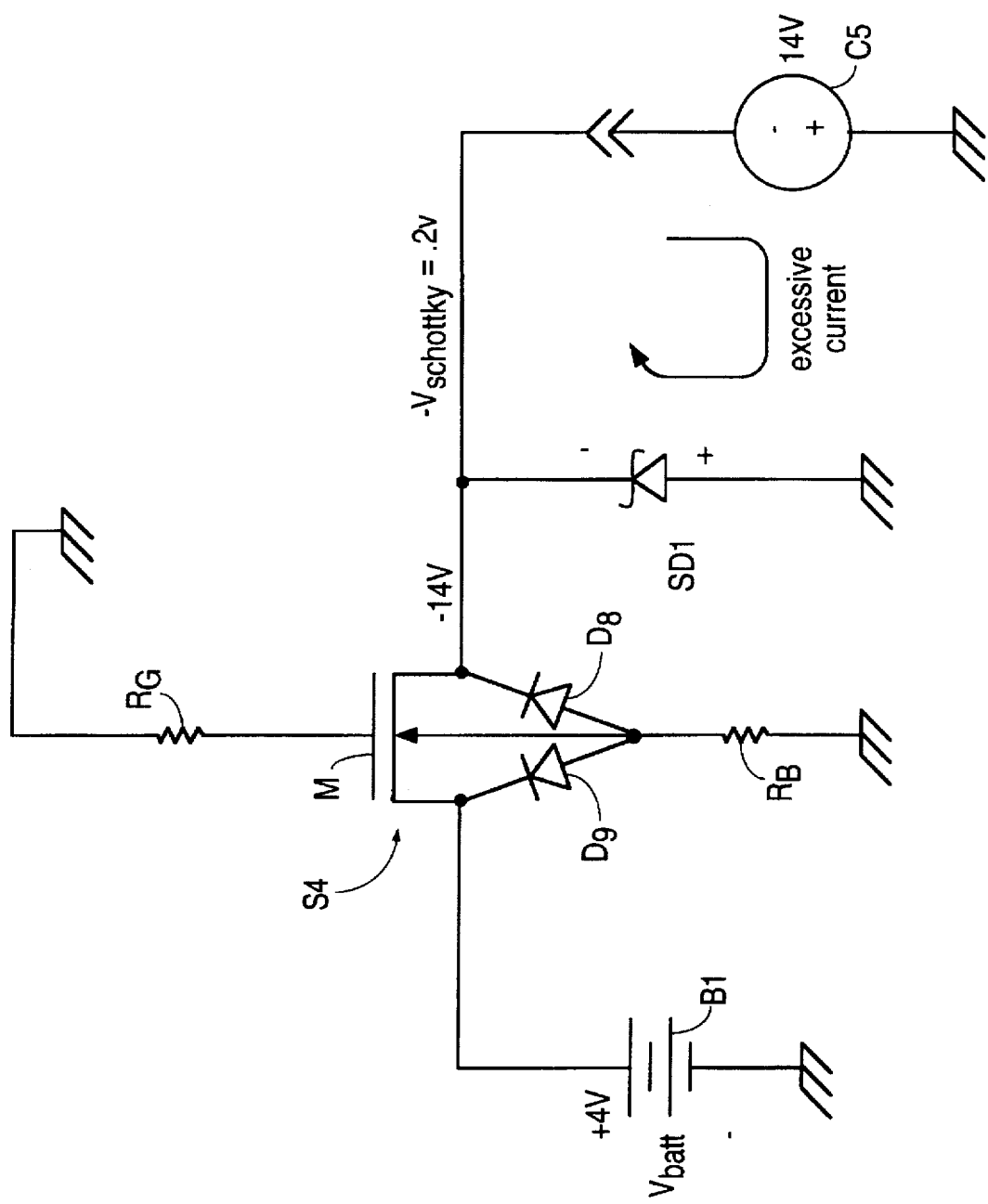

FIGS. 12B–12F illustrate the problems with several unsuccessful techniques for solving this problem. In FIG. 12B, a Schottky diode SD1 is connected between the body and source terminals of MOSFET M. A resistor $R_B$ limits the current through the Schottky diode SD1. Schottky diode SD1 effectively limits the base-emitter voltage of the intrinsic bipolar transistor to 0.2V, thereby preventing the bipolar transistor from completely turning on. Resistor $R_B$ limits the current through Schottky diode SD1. Nonetheless, MOSFET M turns fully on because of the high gate-to-source voltage, i.e., 14V, and switch S4 may be destroyed due to excessive current. In FIG. 12C, Schottky diode SD1 is connected between ground and the source of MOSFET M. In this arrangement, excessive currents are generated through Schottky diode SD1, and Schottky diode SD1 may therefore be destroyed. If resistor $R_B$ is connected in series with Schottky diode SD1, Schottky diode SD1 will fail to perform its function of turning MOSFET M off. In FIG. 12C, a diode D9 represents the junction between the body and drain regions of MOSFET M. As above, diode D8 represents the junction between the body and source regions of MOSFET M.

Figure 12D:
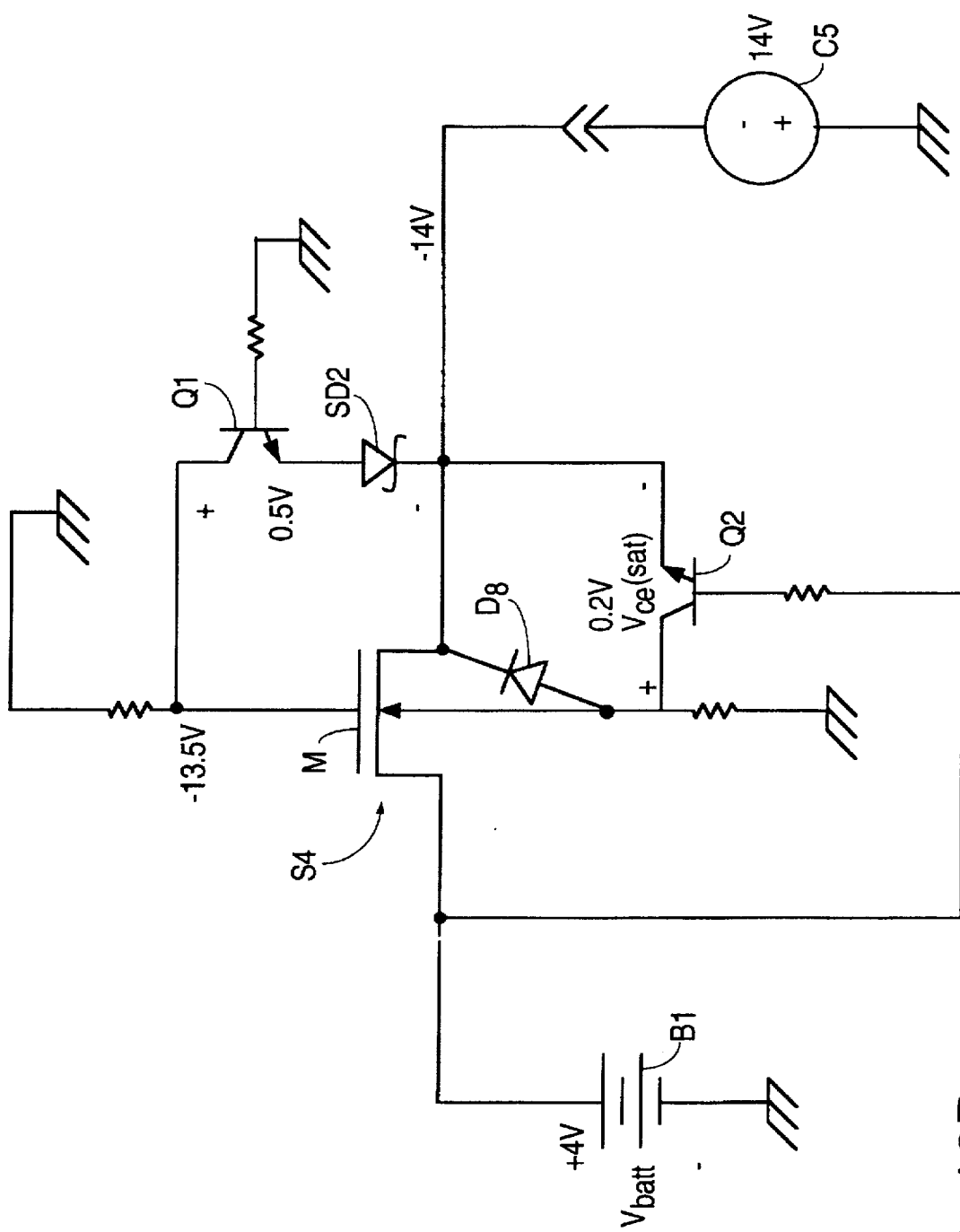

In the arrangement shown in FIG. 12D, a bipolar transistor Q1 and a Schottky diode SD2 are connected between the gate and source terminals of MOSFET M. A second bipolar transistor Q2 is connected between the body and source terminals of MOSFET M. Herein, the terminal of MOSFET M which is connected to the battery charger is referred as the source terminal, and the terminal of MOSFET M which is connected to the battery is referred to as the drain terminal. Since the base of transistor Q2 is at about 4V, transistor Q2 is turned on, and transistor Q2 provides a $V_{ce}$(sat) of about 0.2V between the body and source of MOSFET M. This prevents the intrinsic bipolar transistor within MOSFET M from turning completely on. However, the combination of transistor Q1 and Schottky diode SD2 allows the gate to source voltage ($V_{GS}$) of MOSFET M to rise to about 0.5V, and this may allow MOSFET M to turn on. Thus the arrangement shown in FIG. 12D does not maintain the switch S4 in an off condition when the battery charger C5 is reverse connected. Transistors Q1 and Q2 are saturated because their base-to-collector and emitter-to-base junctions are both forward-biased in this condition.

Figure 12E:
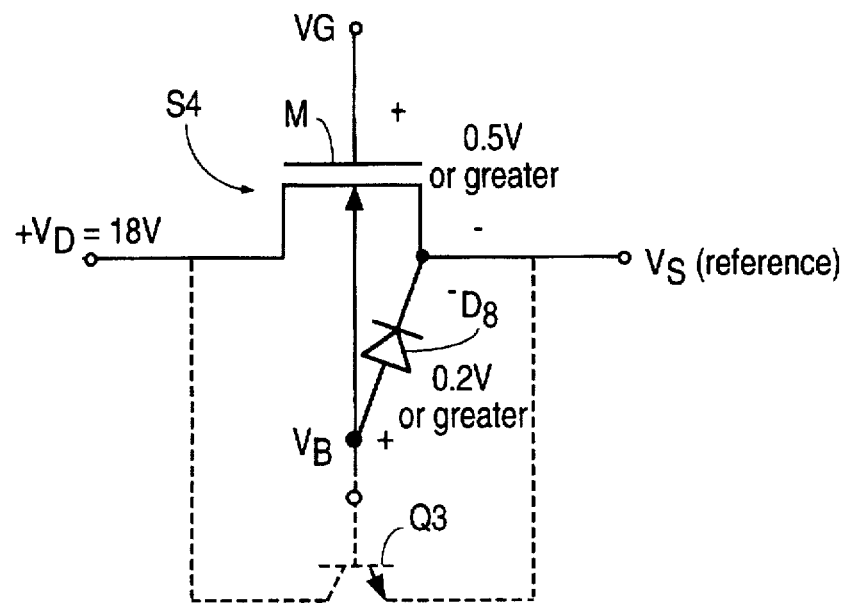
Figure 12F:
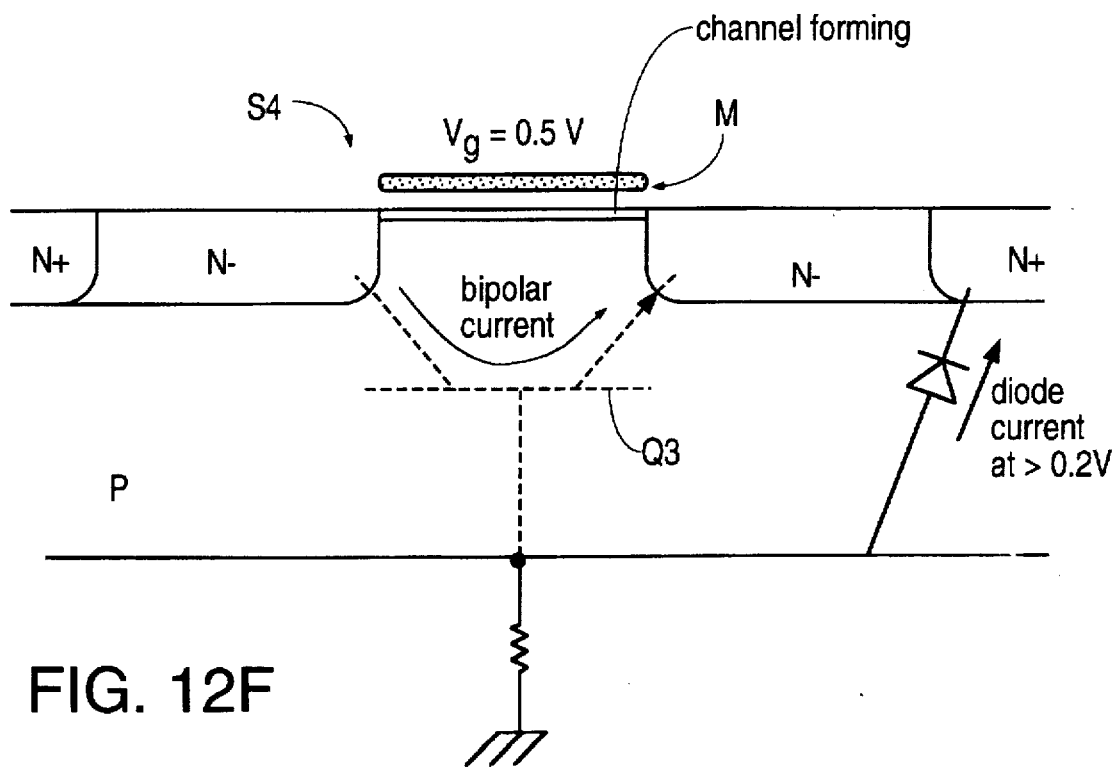

As shown in FIGS. 12E and 12F, these problems intensify as the temperature of switch S4 increases, as is likely when significant amounts of current are flowing through switch S4. In a high-temperature condition, the gain of the bipolar transistor within MOSFET M increases, and the threshold voltage of MOSFET M decreases. In addition, the "antibody effect", a reduction in threshold due to the partial forward-biasing of the source-to-body junction (diode D8), also makes it easier to turn MOSFET M on. FIGS. 12E and 12F show switch S4 as containing an intrinsic bipolar transistor Q3.

Figure 12G:
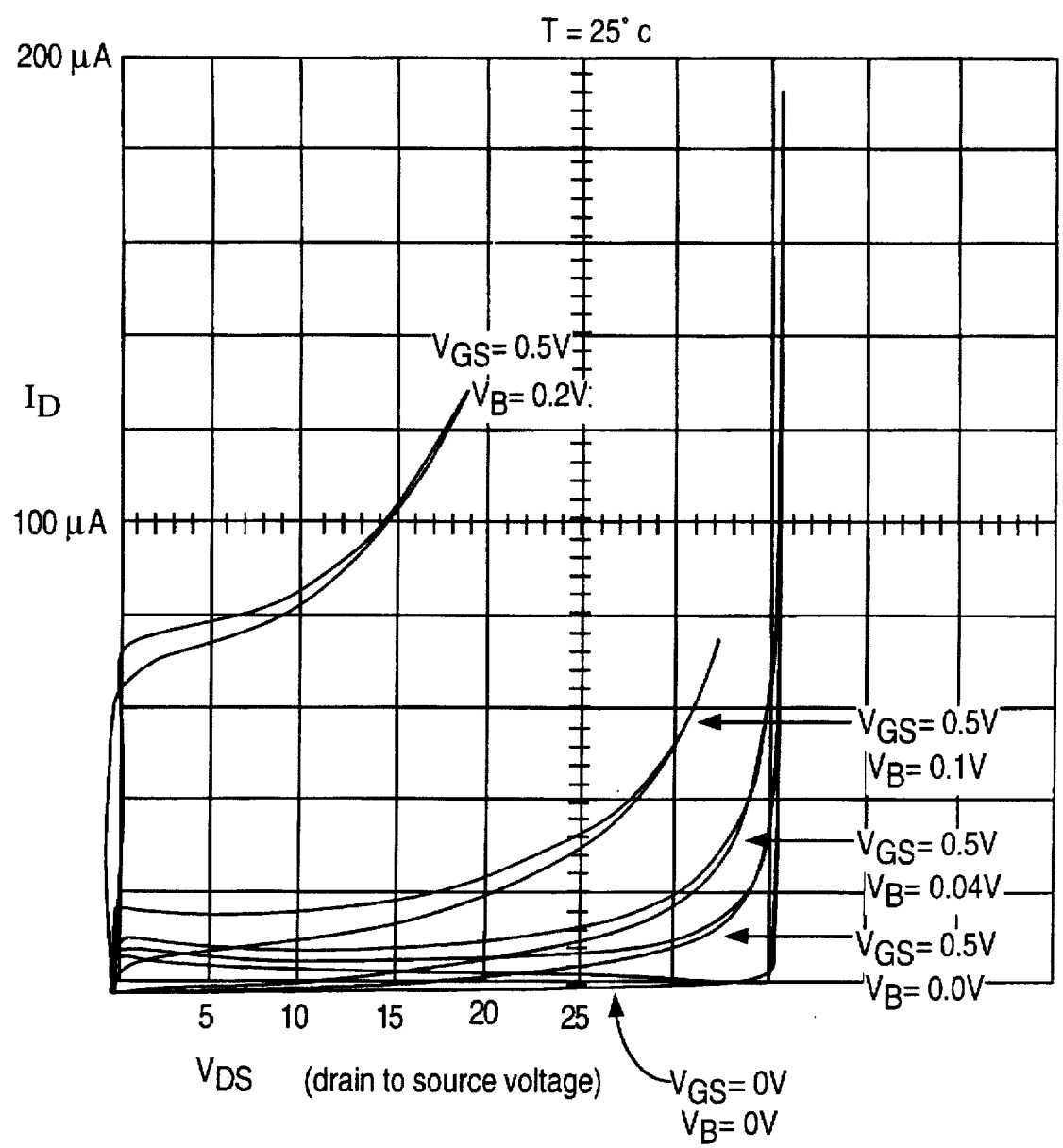

FIG. 12G illustrates a series of curves showing the relationship between the current $I_D$ through switch S4 as a function of the drain-to-source voltage $V_{DS}$ of MOSFET M. In FIG. 12G, $V_{GS}$ represents the gate-to-source voltage of MOSFET M, and $V_B$ represents the source-to-body voltage of MOSFET M. As is apparent from FIG. 12G, when $V_{GS}$ equals 0.5V and $V_B$ equals 0.2V, the current $I_D$ increases rapidly in the vicinity of a $V_{DS}$ of 18V. In other words, the device is in a region bordering on massive currents, and any variations in fabrication or temperature may cause it to be destroyed. Ideally, the "square" I–V characteristics of the $V_{GS}=0$, $V_B=0$ curve are desired.

Figure 13A:
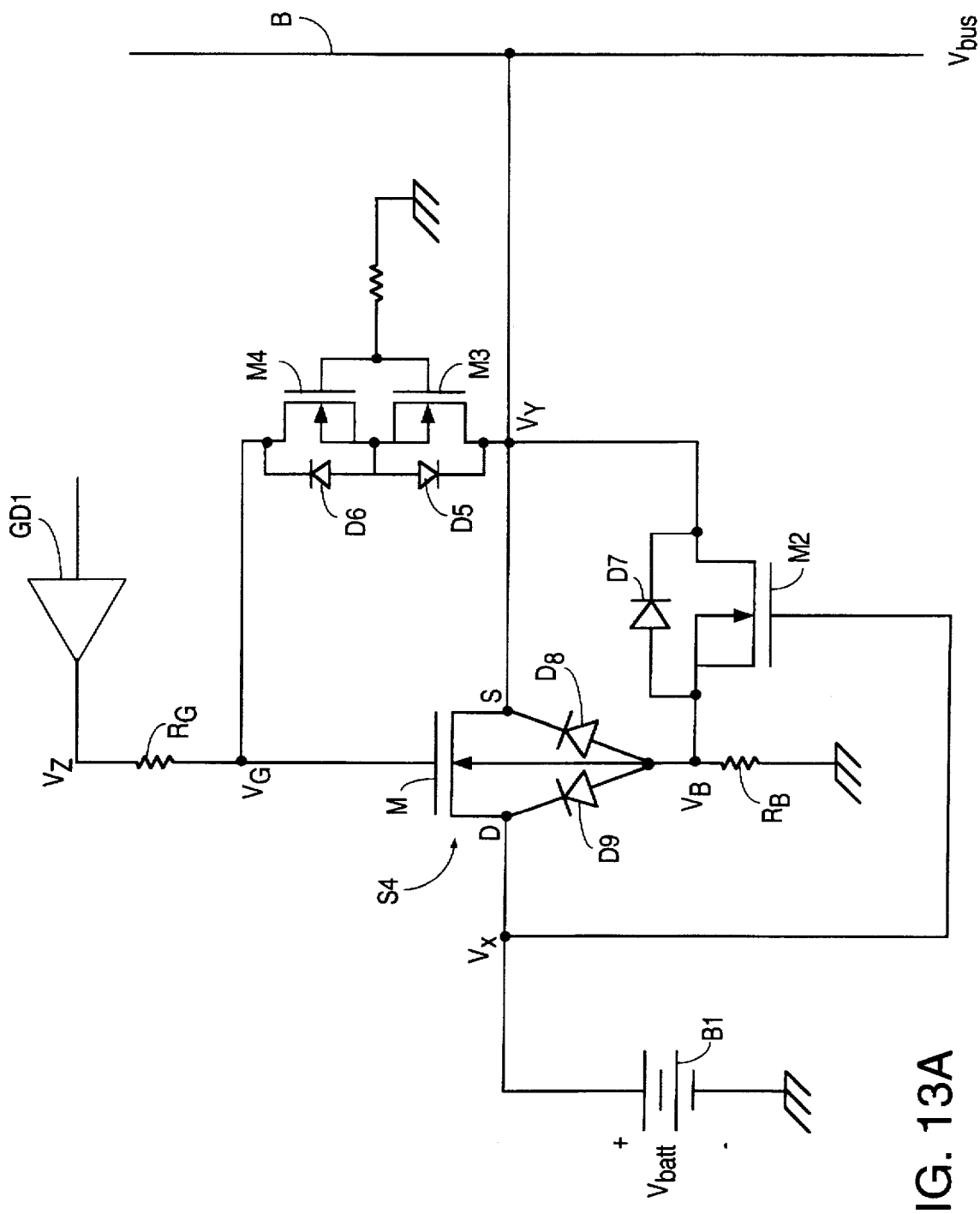
FIGS. 13A–13E illustrate a battery disconnect switch including circuitry which protects the switch against a reversed battery charger, in several voltage conditions to which the battery disconnect switch may be exposed.

FIG. 13A illustrates a battery disconnect switch with protective circuitry in accordance with this aspect of the invention. Switch S4 includes a MOSFET M which, as described above, has no source-body short. Diodes D8 and D9 represent the junctions between the body-and-source regions and the body-and-drain regions, respectively, of MOSFET M. The drain voltage of MOSFET M is designed $V_X$; the source voltage of MOSFET M is designated $V_Y$; the body voltage of MOSFET M is designated $V_B$; and the gate voltage of MOSFET M is designated $V_G$. A gate driver CG1 of the kind described in the above-mentioned application Ser. No. 08/160,560, now U.S. Pat. No. 5,510,747 is used to drive the gate of MOSFET M through a gate resistor $R_G$.

MOSFETs M3 and M4 are connected between the gate and source of MOSFET M. MOSFETs M3 and M4 are connected in series in a source-to-source configuration. The gates of MOSFETs M3 and M4 are grounded. Diodes D5 and D6 represent the antiparallel diodes within MOSFETs M3 and M4, respectively.

A MOSFET M2 is connected between the body and source of MOSFET M, with the source of MOSFET M2 being connected to the body of MOSFET M, and the drain of MOSFET M2 being connected to the source of MOSFET M. A diode D7 represents the antiparallel diode within MOSFET M2. The gate of MOSFET M2 is connected to the drain of MOSFET M, biased at a potential $V_X$.

The bus B shown in FIG. 13A could be connected to a battery charger, a backup battery, an adaptor from a car lighter, or any other voltage source.

While the protective circuitry is shown with switch S4 in FIG. 3, it will be apparent that the protective circuitry could also be used with switch S1 if the battery charger C5 were connected to the bus B.

Figure 13B:
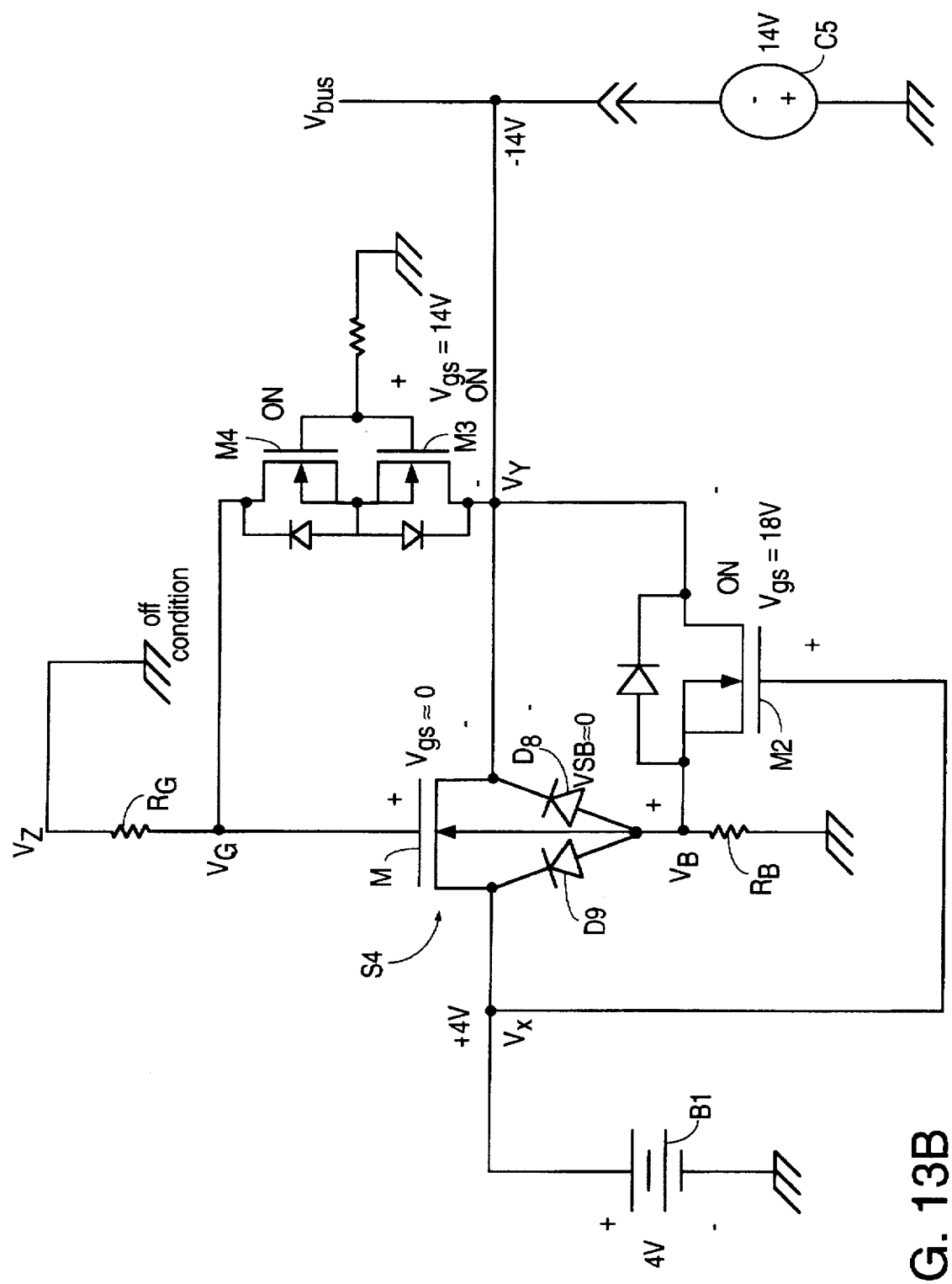

FIGS. 13B–13E illustrate the operation of this circuitry in several different situations. FIG. 13B shows the situation in which the output of gate driver GD1 provides a ground to the gate of MOSFET M, turning switch S4 off. Reverse-connected battery charger C5 provides a voltage of −14V to the source of MOSFET M, and battery B1 provides a voltage of +4V to the drain of MOSFET M. Since the gate of MOSFET M3 is 14V more positive than its terminal biased at $V_Y$, MOSFET M3 is turned on. As a result, the common terminal between MOSFETs M3 and MOSFET M4 is likewise at $V_Y$, 14V below its gate, MOSFET M4 is turned on. Therefore, the gate of MOSFET M is held at a voltage close to −14V, and MOSFET M is turned off.

The gate of MOSFET M2 is at +4V, and this turns MOSFET M2 on, effectively providing a short between the source and body of MOSFET M. Since the value of $R_B$ is much greater than the on-resistance of MOSFET M2, $V_B$ is approximately equal to $V_Y$. This turns the bipolar transistor within MOSFET M off.

As a result, in this condition both MOSFET M and the intrinsic bipolar transistor within MOSFET M are turned off, and this protects switch S4 from the massive currents that may otherwise flow in the presence of an 18V drop across switch S4.

Figure 13C:
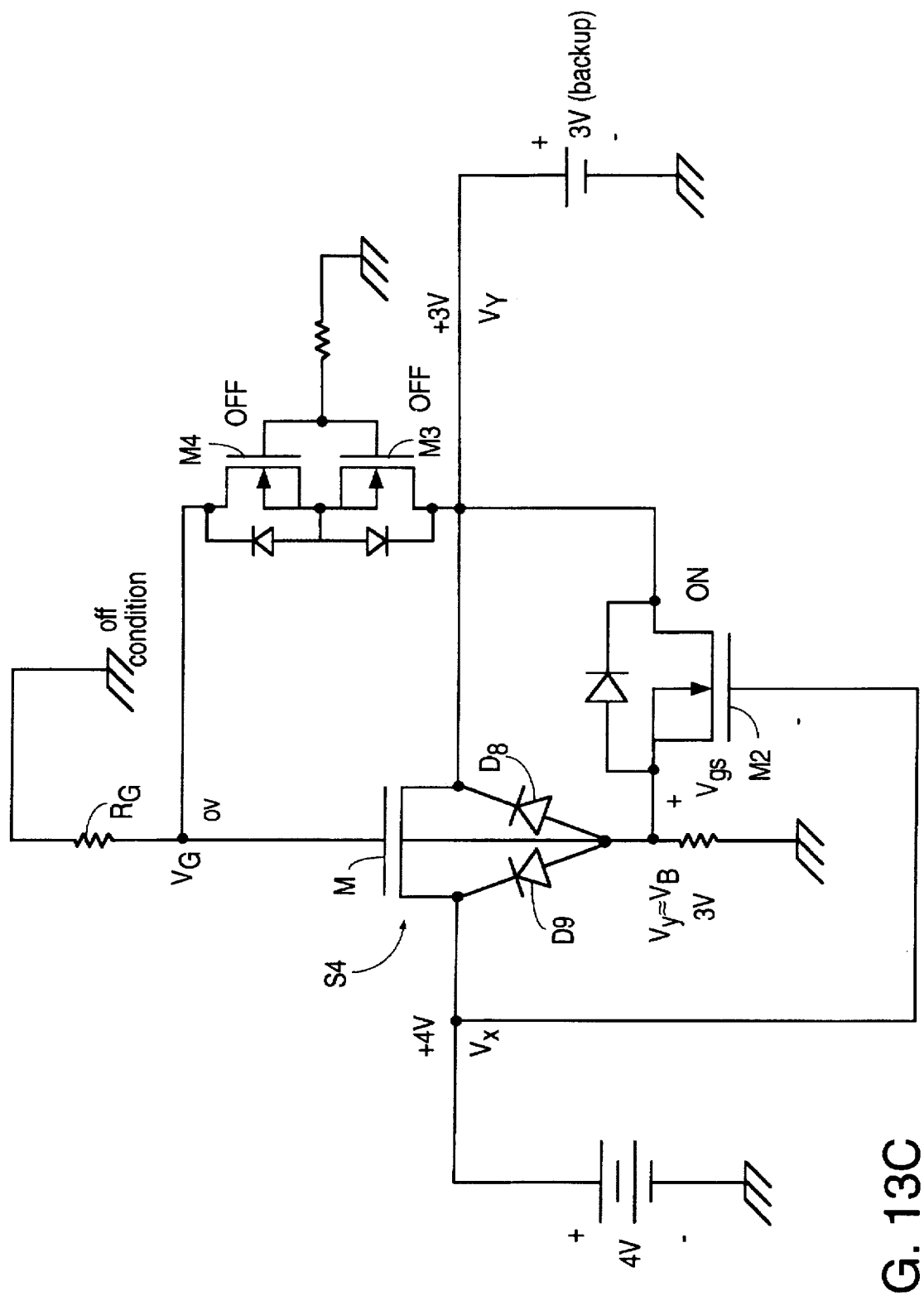

FIG. 13C illustrates the situation in which switch S4 is connected to a 3V backup battery, a normal operating condition, so that the voltage drop across switch S4 is 1V. Here MOSFETs M3 and M4 are both turned off since their gates are grounded. Therefore, the gate of MOSFET M is grounded, and MOSFET M is turned off. MOSFET M2 is turned on, shorting the body region of MOSFET to its source, but this does not create a problem because $V_X>V_Y$. Therefore, diode D9 remains reverse-biased while diode D8 is shorted.

Figure 13D:
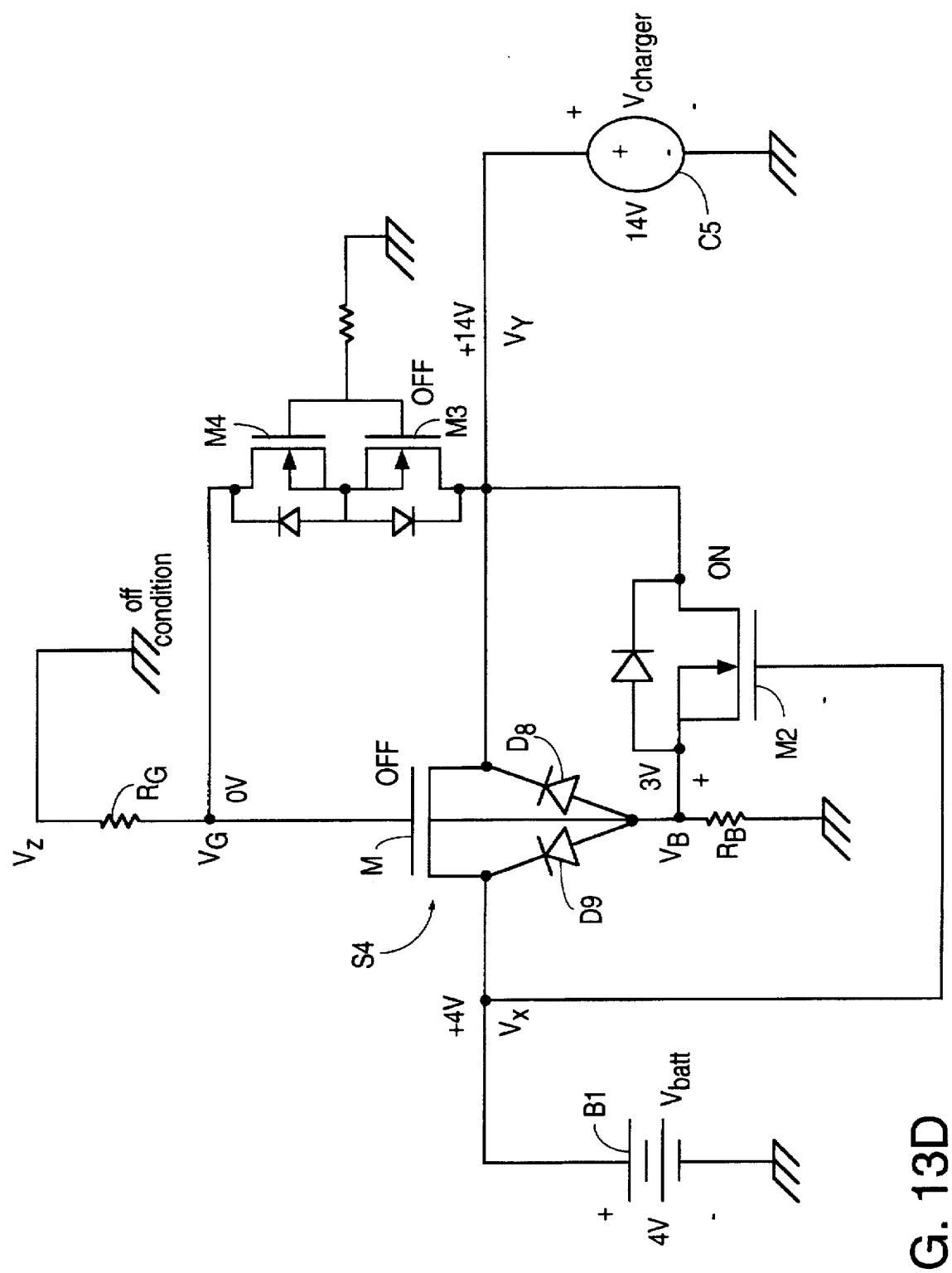

FIG. 13D illustrates the situation in which battery charger C5 is properly connected and the gate of MOSFET M is biased to an off condition by driver GD1. MOSFETs M3 and M4 are both turned off, and the gate of MOSFET M is grounded, turning MOSFET M off. Since $V_Y>V_X$, the operation of transistor M2 must establish a voltage $V_B$ which does not forward-bias diode D9. MOSFET M2 is turned on, but the source of MOSFET M2 does not rise to the +14V volt level of $V_Y$, but instead follows the voltage at the gate of MOSFET M2. In fact, the voltage at the body of MOSFET M ($V_B$), is equal to the voltage at the gate of MOSFET M2, less the summation of the threshold voltage of MOSFET M2 and a voltage drop which depends on the drain current through MOSFET M2.

$$V_B = V_X - \left( V_t(M2) + \sqrt{\frac{I_D(M2)}{K(M2)}} \right)$$

where $V_t(M2)$, $I_D(M2)$ and K (M2) are the threshold voltage, drain current and transconductance factor, respectively, of MOSFET M2.

From this expression, it is clear that $V_B$ is always less than $V_X$. Therefore, diode D9 is never forward-biased.

Figure 13E:
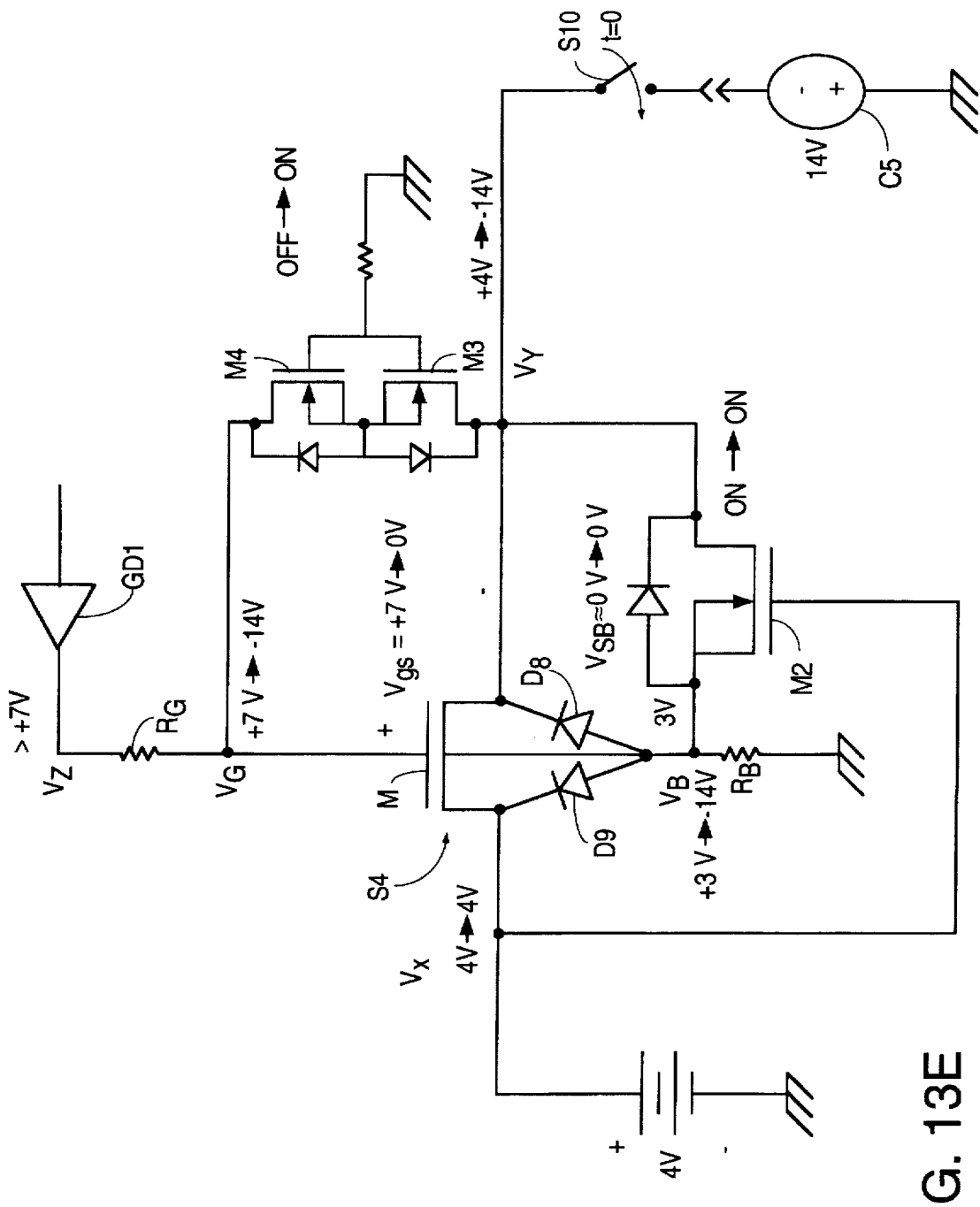

FIG. 13E illustrates the situation in which driver GD1 delivers a voltage (e.g., 7V or greater), which biases switch S4 into an on condition. FIG. 13E further shows the transient circuit operation during the application of a reverse connected battery charger while switch S4 is on. The connection of battery charger C5 is represented by a switch S10 and occurs at a time t=0. Prior to the connection of battery charger C5, MOSFET M2 is turned on, and MOSFETs M3 and M4 are turned off. At time t=0, $V_Y$ falls from +4V to −14V. MOSFET M2 remains on and passes this voltage to the body of MOSFET M. MOSFETs M3 and M4 switch from an off condition to an on condition, and thus the voltage at the gate of MOSFET M falls from +7V to −14V.

As a result, with the gate voltage of MOSFET M at −14V, MOSFET M is turned off. Similarly, with MOSFET M2 turned on, the intrinsic bipolar transistor within MOSFET M is also kept off. With both MOSFET M and the intrinsic bipolar transistor turned off, switch S4 is protected against large current flows that might otherwise occur in this situation. Because $V_b$ tracks any change in $V_Y$ and transistors M3 and M4 turn on quickly, conduction in MOSFET M is immediately suppressed during a reverse charger transient.

Figure 14A:
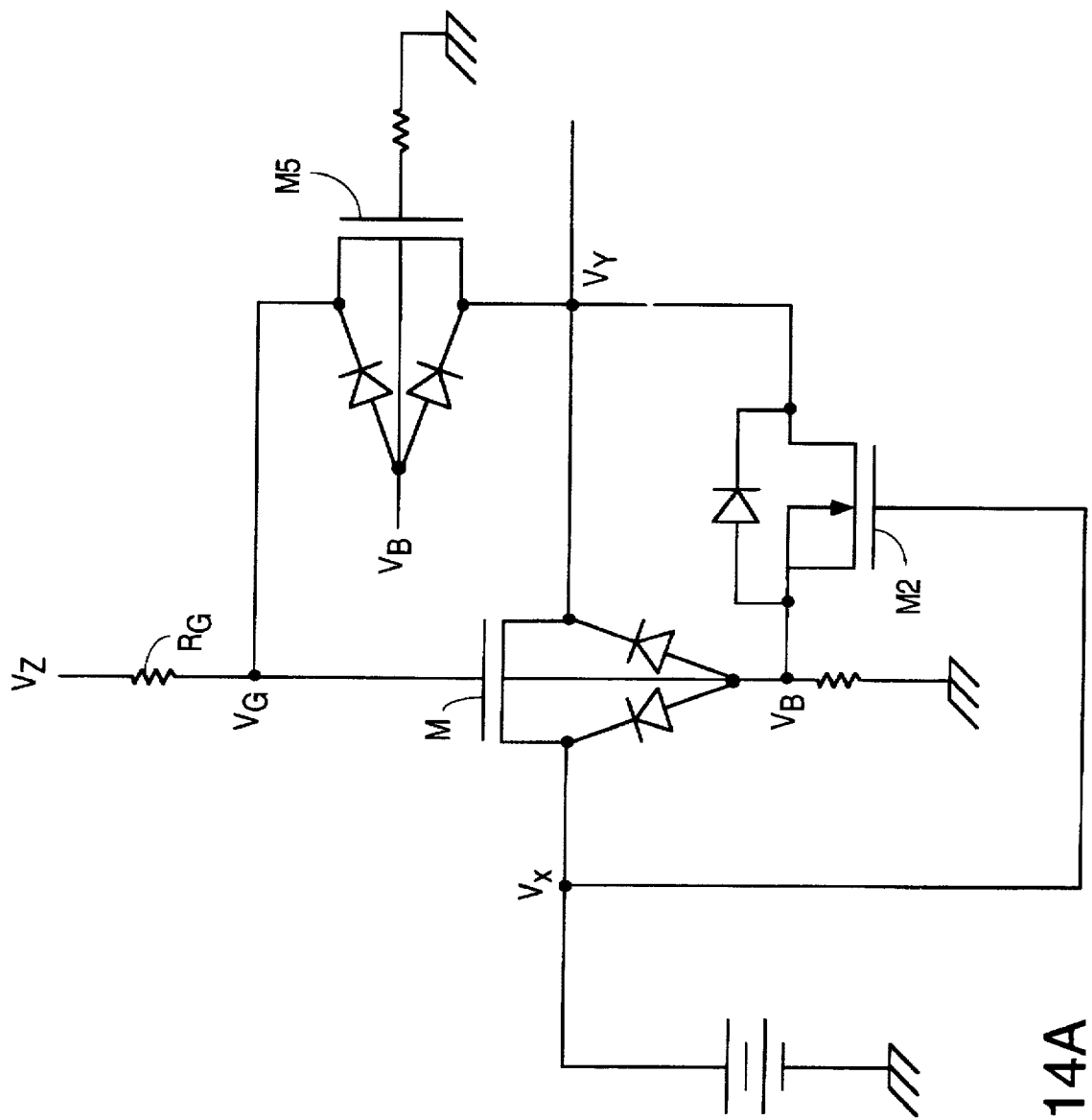
FIGS. 14A and 14B illustrate an embodiment in which the battery disconnect switch and the circuitry protecting the switch against a reversed battery charger are fabricated in the form of an integrated circuit.
Figure 14B:
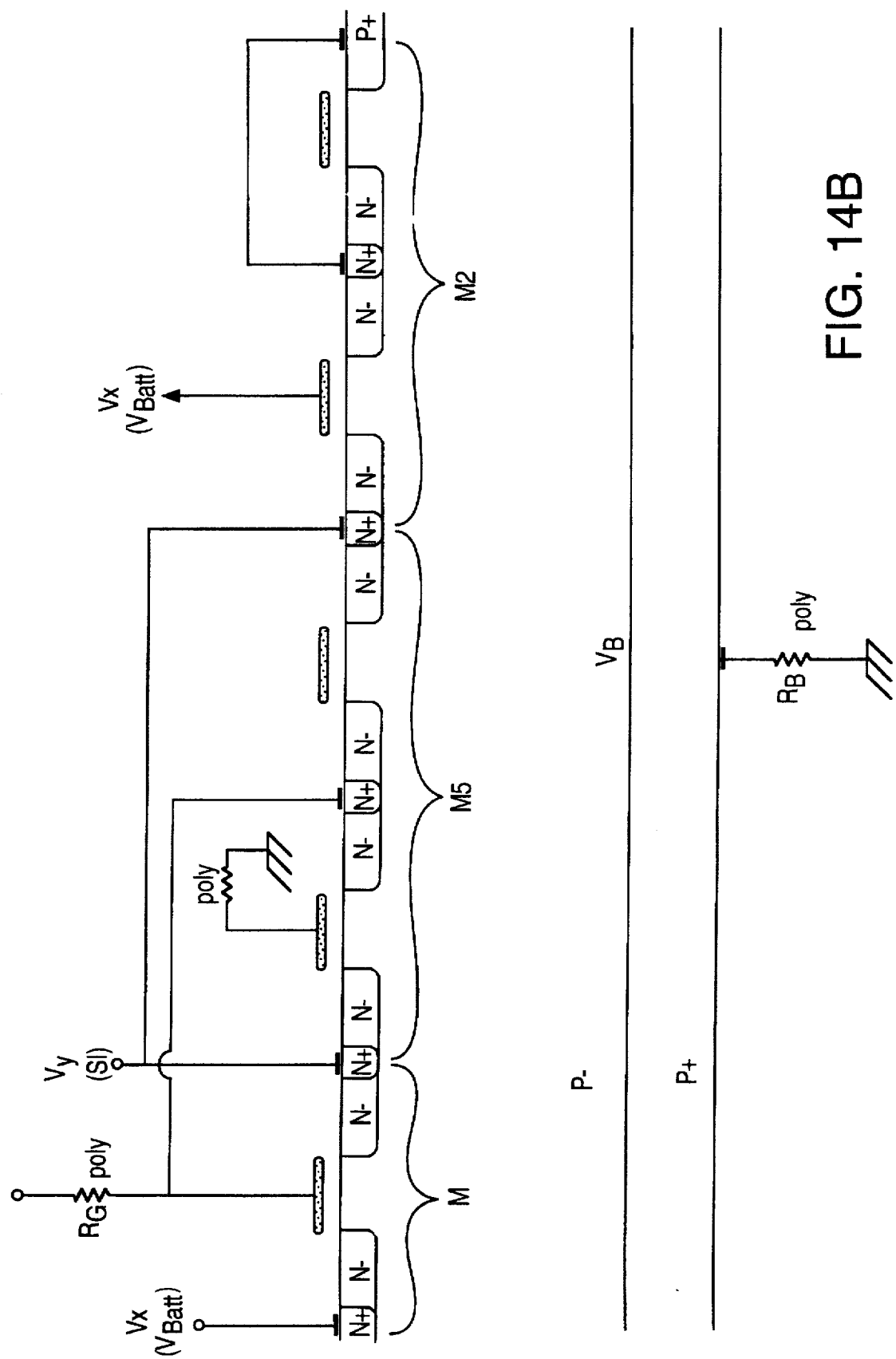

FIGS. 14A and 14B illustrate an alternative embodiment in which the entire circuit may be constructed in a single integrated circuit. A MOSFET M5 having no source-body short is connected in place of MOSFETs M3 and M4. Thus MOSFET M5 is similar to MOSFET M.

FIG. 14B shows a cross-sectional view of the integrated circuit, which is formed in a P− substrate. A voltage $V_Z$ from driver GD1 is applied through resistor $R_G$ to the gate of MOSFET M and the source of MOSFET M5. The source voltage $V_Y$ of MOSFET M is applied to the drain of MOSFET M5. MOSFET M5 is an annular-shaped device with a central source surrounded by an annular gate and an annular drain. The drain of MOSFET M5 is in contact with the drain of MOSFET M2. MOSFET M2 is likewise an annular device with a central source surrounded by an annular gate and an annular drain. The source of MOSFET M2 is shorted to a P+ region which is formed in the P− substrate. As will be apparent, the body regions of MOSFETs M1, M2 and M5 are all at the same potential $V_B$ so that no isolation is required.

Figure 15A:
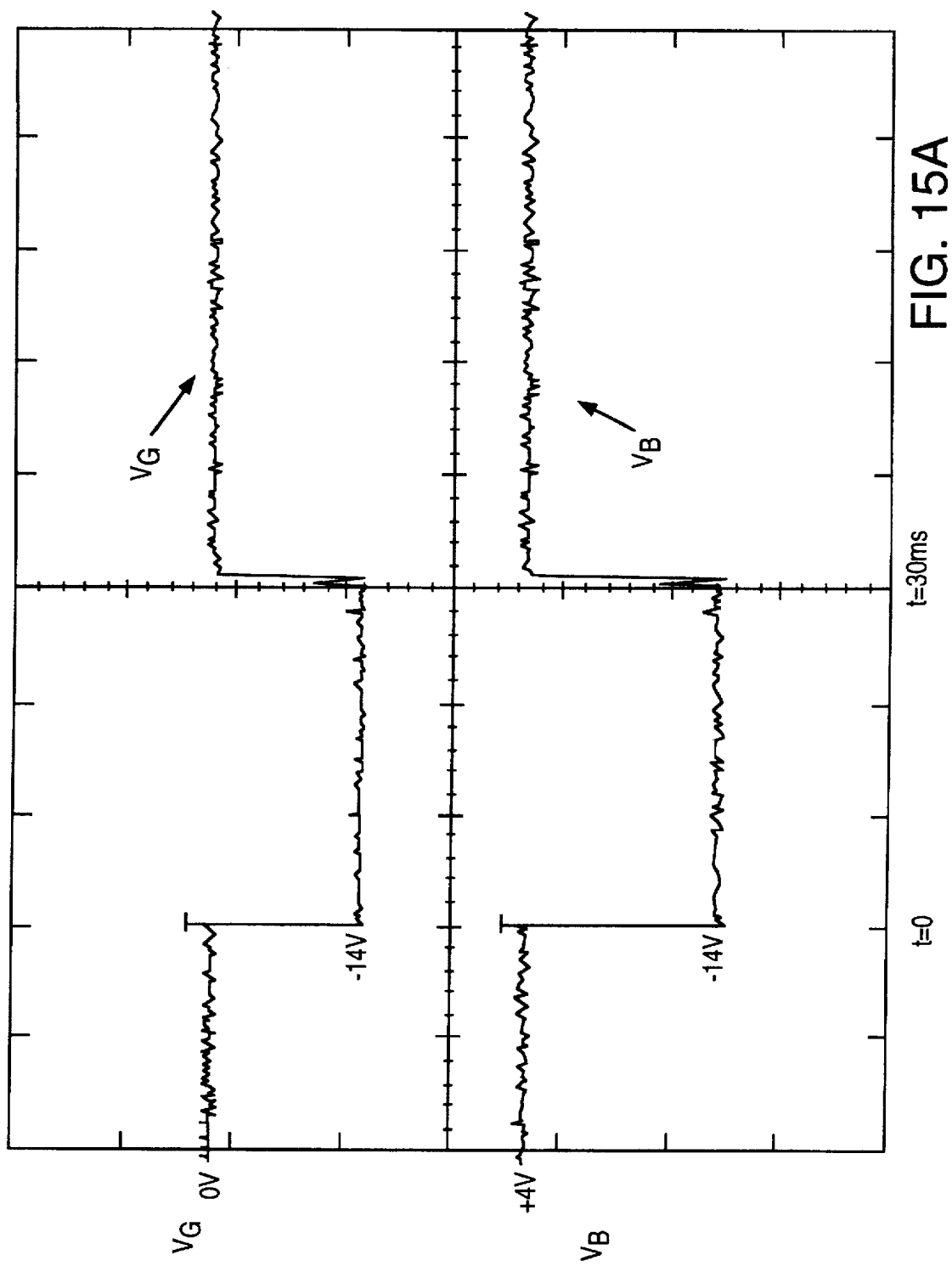
FIGS. 15A and 15B illustrate test results of the protective circuitry.
Figure 15B:
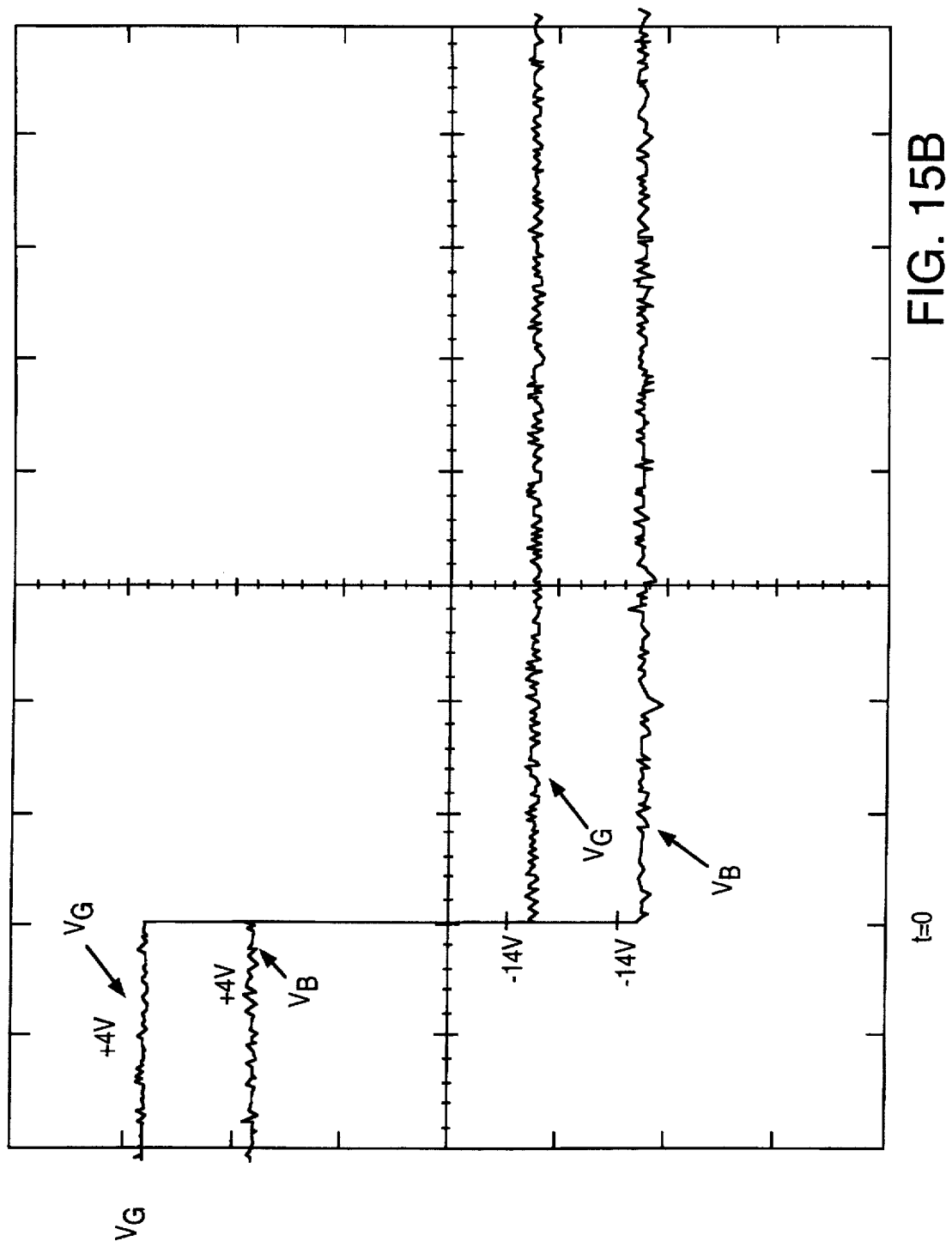

FIGS. 15A and 15B illustrate the response of the gate voltage $V_G$ and body voltage $V_B$ of MOSFET M to the connection and disconnection of a reversed battery charger. In FIG. 15A, MOSFET M is off prior to the reversed charge connection, with its gate at 0V and its body at +4V. The connection is made at t=0 and the disconnection at t=30 ms. The switching transients are rapid and free from ringing. FIG. 15B shows a similar transition when MOSFET M is on prior to the reversed charger transient. In such a case, both $V_G$ and $V_B$ are biased at +4V and are immediately switched to −14V at t=0. FIG. 15A depicts the transient leading to the condition shown in FIG. 13B. FIG. 15B corresponds to the transient described in FIG. 13E, except that for convenience, the gate drive voltage $V_Z$ is biased to +4V instead of +7V.

Figure 6A:
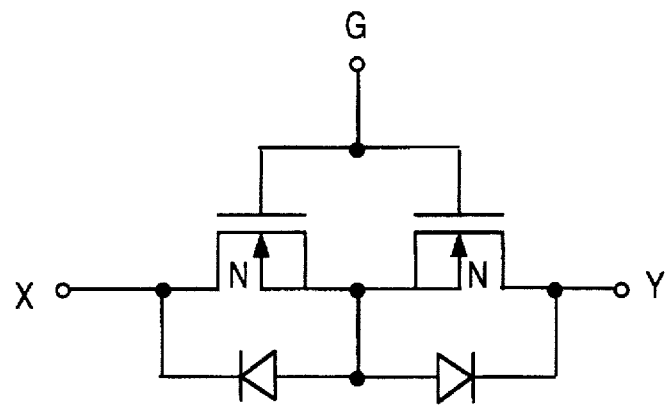
FIGS. 6A–6C illustrate bidirectional current blocking switches consisting of back-to-back MOSFETs.
Figure 6B:
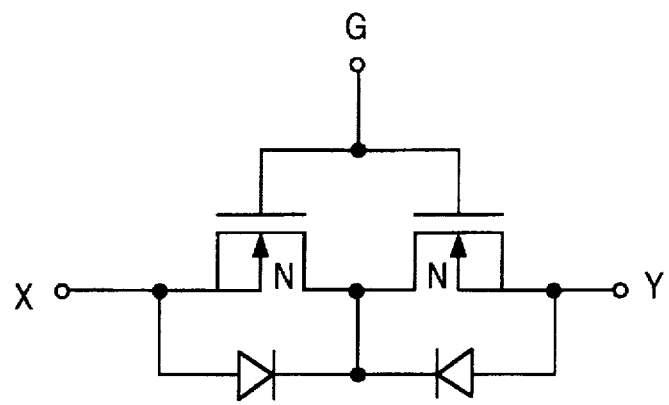
Figure 6C:
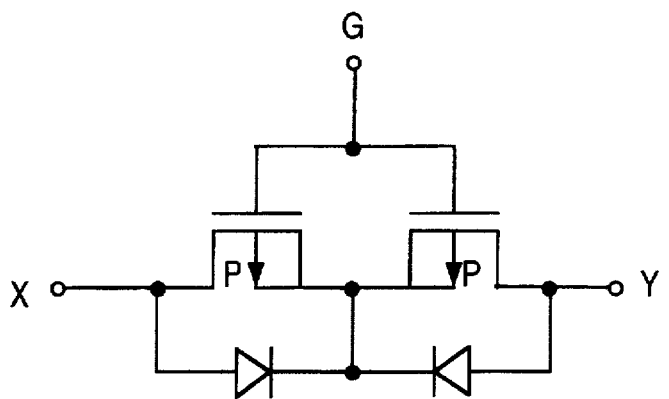

The foregoing examples are intended to be illustrative and not limiting. Many additional and alternative embodiments according to this invention will be apparent to those skilled in the art. For example, the protective circuitry shown in FIGS. 13A and 14A could be used with other types of battery disconnect switches, such as the arrangement of back-to-back MOSFETs shown in FIGS. 6A–6C. All such embodiments are intended to be covered within the scope of this invention, as defined in the following claims.

I claim:

1. A bidirectional current blocking switch comprising:
    a first MOSFET comprising:
        a semiconductor substrate;
        a first N region and a second N region formed in said substrate and being connected to first and second terminals, respectively;
        a P body region formed in said substrate, said P body region comprising a channel region located between said first and second N regions, said P body region being connected to ground; and
        a gate;
        wherein neither of said first and second N regions is permanently shorted to said P body region;
    second and third MOSFETs connected in series between said gate and said second terminal of said first MOSFETs; and
    a fourth MOSFET connected between said P body region and said second terminal of said first MOSFET, a gate of said fourth MOSFET being connected to said first terminal of said first MOSFET.

2. The bidirectional current blocking switch of claim 1 wherein a gate of said second MOSFET and a gate of said third MOSFET are connected to ground.

3. The bidirectional current blocking switch of claim 1 wherein respective source terminals of said second and third MOSFETs are shorted together.

4. The bidirectional current blocking switch of claim 1 wherein a source of said fourth MOSFET is connected to said P body region.

5. A bidirectional current blocking switch comprising:
    a first MOSFET comprising:
        a semiconductor substrate;
        a first N region and a second N region formed in said substrate and being connected to first and second terminals, respectively;
        a P body region formed in said substrate, said P body region comprising a channel region located between said first and second N regions, said P body region being connected to ground; and
        a gate;
        wherein neither of said first and second N regions is permanently shorted to said P body region;
    a second MOSFET, said second MOSFET not including a source-body short, a body region of said second MOSFET being connected to ground, said second MOSFET being connected between said gate and said second terminal of said first MOSFET; and
    a third MOSFET connected between said P body region and said second terminal of said first MOSFET, a gate of said third MOSFET being connected to said first terminal of said first MOSFET.

6. The bidirectional current blocking switch of claim 5 wherein a gate of said second MOSFET is connected to ground.

7. A bidirectional current blocking switch in the form of an integrated circuit comprising:
    a P substrate;
    a first N region and a second N region, said first N region and said second N region being separated by a first region of said P substrate, a first gate overlying said first region of said P substrate;
    a third N region, said third N region being separated from said second N region by a second region of said P substrate, a second gate overlying said second region of said P substrate; said second gate being connected to said P substrate;
    a first terminal connected to said first N region;
    a second terminal connected to said second N region; and
    a third terminal connected to said first gate and to said third N region;
    wherein none of said N regions is shorted to said P substrate.

8. The integrated circuit of claim 7 further comprising a fourth N region, said fourth N region being separated from said second N region by a third region of said P substrate, a third gate overlying said third region of said P substrate, said third gate being connected to said first terminal.

9. The integrated circuit of claim 8 wherein said fourth N region is shorted to said P substrate.

10. A bidirectional current blocking switch comprising a first MOSFET, said first MOSFET not including a permanent source-body short, and a pair of MOSFETs connected in series between a gate and a first terminal of said first MOSFET, said bidirectional current blocking switch further comprising a fourth MOSFET connected between said first terminal and a body region of said first MOSFET.

11. The bidirectional current blocking switch of claim 10, wherein a gate of said fourth MOSFET is connected to a second terminal of said first MOSFET.

12. The bidirectional current switch of claim 11 wherein a gate of each of said pair of MOSFETs is connected to ground.

13. A bidirectional current blocking switch comprising a first MOSFET and a second MOSFET, neither of said first or second MOSFETs including a permanent source-body short, said second MOSFET being connected between a gate and a first terminal of said first MOSFET, a body of said first MOSFET and a body and a gate of said second MOSFET being connected together.

14. The bidirectional current blocking switch of claim 13 further comprising a third MOSFET, said third MOSFET being connected between said first terminal and said body of said first MOSFET, a gate of said third MOSFET being connected to a second terminal of said first MOSFET.

15. The bidirectional current blocking switch of claim 14 wherein said body of said first MOSFET and said body and said gate of said second MOSFET are grounded.

16. The bidirectional current blocking switch of claim 14 wherein a body and a source of said third MOSFET are shorted together.

* * * * *